United States Patent
Kim et al.

(10) Patent No.: US 7,414,270 B2
(45) Date of Patent: Aug. 19, 2008

(54) SIDE-EMITTING LED PACKAGE HAVING SCATTERING AREA AND BACKLIGHT APPARATUS INCORPORATING THE LED LENS

(75) Inventors: Bum Jin Kim, Kyungki-do (KR); Hyung Suk Kim, Kyungki-do (KR); Ho Sik Ahn, Incheon (KR); Young June Jeong, Kyungki-do (KR); Sung Min Yang, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 56 days.

(21) Appl. No.: 11/370,021

(22) Filed: Mar. 8, 2006

(65) Prior Publication Data

US 2006/0208269 A1    Sep. 21, 2006

(30) Foreign Application Priority Data

Mar. 18, 2005  (KR)  ...................... 10-2005-0022604

(51) Int. Cl.
H01L 27/15    (2006.01)
H01L 29/267   (2006.01)
H01L 31/12    (2006.01)
H01L 33/00    (2006.01)

(52) U.S. Cl. .............................. 257/81; 257/79; 257/98
(58) Field of Classification Search ................... 257/79, 257/81, 98

See application file for complete search history.

(56) References Cited

U.S. PATENT DOCUMENTS

| | | | | |
|---|---|---|---|---|
| 6,570,190 B2* | 5/2003 | Krames et al. | ................. | 257/94 |
| 6,576,930 B2* | 6/2003 | Reeh et al. | ..................... | 257/98 |
| 6,598,998 B2* | 7/2003 | West et al. | .................. | 362/307 |
| 6,674,096 B2* | 1/2004 | Sommers | ..................... | 257/98 |
| 6,791,116 B2* | 9/2004 | Hirano et al. | ................. | 257/79 |

(Continued)

FOREIGN PATENT DOCUMENTS

CN    1430731 A    7/2003

(Continued)

OTHER PUBLICATIONS

Chinese Intellectual Property Office, Office Action mailed Aug. 17, 2007 and English Translation.

(Continued)

*Primary Examiner*—Jerome Jackson
*Assistant Examiner*—Anthony Ho
(74) *Attorney, Agent, or Firm*—Lowe Hauptman Ham & Berner

(57) ABSTRACT

The invention provides an LED package and a backlight device incorporating the LED lens. The LED package has a bottom surface and a light exiting surface cylindrically extended around a central axis of the package from the bottom surface. Also, a reflecting surface is positioned on an opposite side of the bottom surface and symmetrical around the central axis such that light incident from the bottom surface is reflected toward the light exiting surface. Further, a scattering area is formed on the reflecting surface. According to the invention, by applying scattering materials on the reflecting surface of the LED package, a reflecting paper does not need to be attached, thereby simplifying a process and reducing the manufacture time and cost.

13 Claims, 20 Drawing Sheets

U.S. PATENT DOCUMENTS

| | | | |
|---|---|---|---|
| 2002/0190262 A1* | 12/2002 | Nitta et al. | 257/99 |
| 2003/0151361 A1* | 8/2003 | Ishizaka | 313/512 |
| 2004/0233664 A1* | 11/2004 | Beeson et al. | 362/231 |
| 2005/0024744 A1* | 2/2005 | Falicoff et al. | 359/737 |
| 2005/0139851 A1* | 6/2005 | Sato | 257/99 |

FOREIGN PATENT DOCUMENTS

| | | |
|---|---|---|
| CN | 2686098 Y | 3/2005 |
| JP | 6-11365 U | 3/1994 |
| JP | 2001-085747 A | 3/2001 |
| JP | 2002-072900 A | 3/2002 |
| JP | 2003-505835 A | 2/2003 |

OTHER PUBLICATIONS

Japanese Patent Office, Office Action mailed Jun. 3, 2008 and English Translation.

* cited by examiner

SIDE-EMITTING LED PACKAGE HAVING SCATTERING AREA AND BACKLIGHT APPARATUS INCORPORATING THE LED LENS

CLAIM OF PRIORITY

This application claims the benefit of Korean Patent Application No. 2005-22604 filed on Mar. 18, 2005, in the Korean Intellectual Property Office, the disclosure of which is incorporated herein by reference.

BACKGROUND OF THE INVENTION

1. Field of the Invention

The present invention relates to a light-emitting diode (LED) package for a backlight device. More particularly, the present invention relates to a side-emitting LED package having scattering material applied on a reflecting surface, and a backlight device incorporating the LED lens.

2. Description of the Related Art

Applications using a light emitting diode (LED) as a light source are found in an LCD backlight device (system), a lighting device and the like. Also, in broader applications, an optical package may be employed in the LED to further enhance its efficiency and functions.

FIG. 1 shows an example of an LED package for an LCD backlight device.

The LED package of FIG. 1 is a side-emitting LED package 10 comprising a bottom surface 12, a side surface 14 and a funnel-shaped reflecting surface 16. An LED chip 18 is disposed inside the package 10 and the bottom surface 12 of the package 10 is supported by a mount 20 such as a printed circuit board.

The reflecting surface 16 is symmetrical around an axis A such that light generated in the chip 18 is reflected toward the side surface 14. In addition, the center of the LED chip 18 is placed on the axis A. As denoted by reference numeral L1 of FIG. 1, this allows a majority of light generated in the LED chip 18 to be emitted outward through the side surface 14.

However, some portions of light L2, L3 generated in the LED 18 are first reflected from the side surface 14, and then exit upward from the package 10 trough the reflecting surface 16. Alternatively, the light L2, L3 passes through the reflecting surface 16 along the axis line A to exit upward. Also, light L3 generated on an edge of the LED chip is emitted upward from the package through a central portion of the reflecting surface 16.

The light emitted upward radiates in a narrow and strong band. Thus without eliminating it, the LED package 10 is hardly adopted in the LCD backlight device or indirect lighting.

Therefore, to overcome this problem, as shown in FIG. 2, a reflector or reflecting paper 30 is attached to the LED package 10.

The reflecting paper 30 is attached to a top of the LED package 10 to reflect light exiting upward. Light L1, L2 reflected by the reflecting paper 30 enters inside of the LED package 10 again or disappears between a reflecting surface 16 and the reflecting paper 30, or inside the package. This completely blocks light from exiting upward from the package 10, and easily ensures the light to be emitted sideward.

At this time, a bonding section B between the package 10 and reflecting paper 30 is formed on the top of the reflecting surface 18 so that it has a narrow bonding area and thus a weak bonding force. Therefore, for smooth and secure bonding, the package 10 needs to be reconstructed partially. Meanwhile, such reflecting paper attached may lead to undesired reflection of light L3.

To attach the reflecting paper is a delicate manual job that can be hardly automated, thus increasing the manufacture time and cost for the backlight device. Moreover, the reflecting paper attached easily falls off, undermining reliability of the backlight device.

Problems arise when the structure of FIG. 2 is applied to the backlight device. An explanation thereof will be given hereunder with reference to FIG. 3.

As shown in FIG. 3, a direct-type backlight device 40 comprises a flat reflecting plate 42, side-emitting LED packages 10 as described in FIGS. 1 and 2 installed on the reflecting plate 42, reflectors or reflecting papers 30 disposed on the LED packages 10 as stated with reference to FIG. 2, a transparent plate 44 positioned at a predetermined distance G1 from the reflecting papers 30 and a diffuser plate 46 positioned at a predetermined distance G2 from the transparent plate 44.

The LED package 10 generally emits light L1, L2 sideward. The light L1 emitted is reflected from the reflecting plate 42, and passes through the above-disposed transparent plate 44. Thereafter, the light L1 is diffused at a desired uniform intensity in the above-disposed diffuser plate 46 and provides a backlight to a liquid crystal panel 48 disposed above. Another light L2 strikes a bottom of the transparent plate 44 and some portions of the light L21 enter the transparent plate 44 and provide a backlight to the liquid crystal panel 48 through the above-disposed diffuser plate 46.

Meanwhile, other portions of the light L22 are reflected from the transparent plate 44 to the reflecting plate 42 and then reflected onto the reflecting plate 42. Then the light L22 provides a backlight to the liquid panel 48 through the transparent plate 44 and diffuser plate 46 in the same manner as the light L1 does.

The backlight device 40 of this structure enables an array of LED packages 10 to be installed below the liquid panel 48, advantageously ensuring an efficient supply of a backlight to a large-sized LCD.

However, a predetermined distance G1 is required between the LED package 10 and the transparent plate 44 and also a predetermined distance G2 should be kept between the transparent plate 44 and the diffuser plate 46. Disadvantageously, this increases a thickness of the backlight device 40 of this structure.

Specifically speaking, light L generated in the LED package 10 is generally reflected upward through between the reflecting papers 30, thus forming dark areas DA shaded by the reflecting papers 30 on the transparent plate 44. To eliminate the dark areas DA and resultant bright lines, a predetermined distance G2 or more should be sufficiently maintained between the transparent plate 44 and the diffuser plate 46 so that lights mix together until before passing through the transparent plate 44 and entering the diffuser plate 46.

As described above, to ensure light traveling from the reflecting plate 32 to the liquid crystal panel 48 to radiate at a uniform intensity, such predetermined distances G1, G2 or more should be maintained, which however necessitates an increase in a thickness of the direct-type backlight device 40.

SUMMARY OF THE INVENTION

The present invention has been made to solve the foregoing problems of the prior art and it is therefore an object of the present invention to provide a side-emitting LED package which does not require a reflecting paper by applying scattering material on a reflecting surface, and a backlight device incorporating the LED lens.

It is another object of the invention to provide a side-emitting LED package which scatters, transmits and reflects some portion of light incident on a reflecting surface to exit upward by applying scattering material on a reflecting surface, and an LCD backlight device incorporating the LED lens.

It is further another object of the invention to provide a side-emitting LED package which can diffuse some portion of light emitted upward through a reflecting surface by applying scattering material on the reflecting surface, and a backlight apparatus incorporating the LED lens.

It is yet another object of the invention to provide a side-emitting LED package which reflects some portion of light incident on a reflecting surface to exit upward in a downward direction and thus prevents light loss resulting from a conventional use of a reflecting paper, and an LCD backlight device incorporating the LED lens.

According to an aspect of the invention for realizing the object, there is provided a light-emitting diode (LED) package comprising: a bottom surface; a light exiting surface cylindrically extended around a central axis of the package from the bottom surface; a reflecting surface positioned on an opposite side of the bottom surface and symmetrical around the central axis such that light incident from the bottom surface is reflected toward the light exiting surface; and a scattering area formed on the reflecting surface.

According to another aspect of the invention for realizing the object, there is provided a backlight device comprising: a reflecting plate; and a plurality of LED packages on the reflecting plate, wherein the LED packages each comprise a bottom surface; a light exiting surface cylindrically extended around a central axis of the package from the bottom surface; a reflecting surface positioned on an opposite side of the bottom surface and symmetrical around the central axis such that light incident from the bottom surface is reflected toward the light exiting surface; and a scattering area formed on the reflecting surface.

The backlight device further comprises a diffuser plate positioned over the light-emitting diode packages and a transparent plate positioned between the LED package and the diffuser plate.

In the LED package and the backlight device, the scattering area comprises a plurality of fine scattering particles and a light transmissible binder having the scattered particles dispersed thereon.

Further, the scattering particles comprise powder of at least one selected from a group consisting of $TiO_2$, $SiO_2$, $CaCo_3$, $SnO_2$, $Nb_2O_5$, $ZnO_2$, $MgF_2$, $CeO_2$, $Al_2O_3$, $HfO_2$, $Na_3LaF_6$ and $LaF_6$.

Further, the binder comprises at least one selected from a group consisting of an acrylic binder, a urethanic binder, a mixed binder, and a proteinic binder.

The reflecting surface has a concave section in an upper part of the package and the scattering area fills the concave section.

Also, the scattering area is a film applied on the reflecting surface.

The light exiting surface comprises a first light exiting surface extended in a smooth convex curve from the bottom surface and a second light exiting surface extended from the first light exiting surface to an edge of the reflecting surface, slanted with respect to the central axis of the package.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 4:
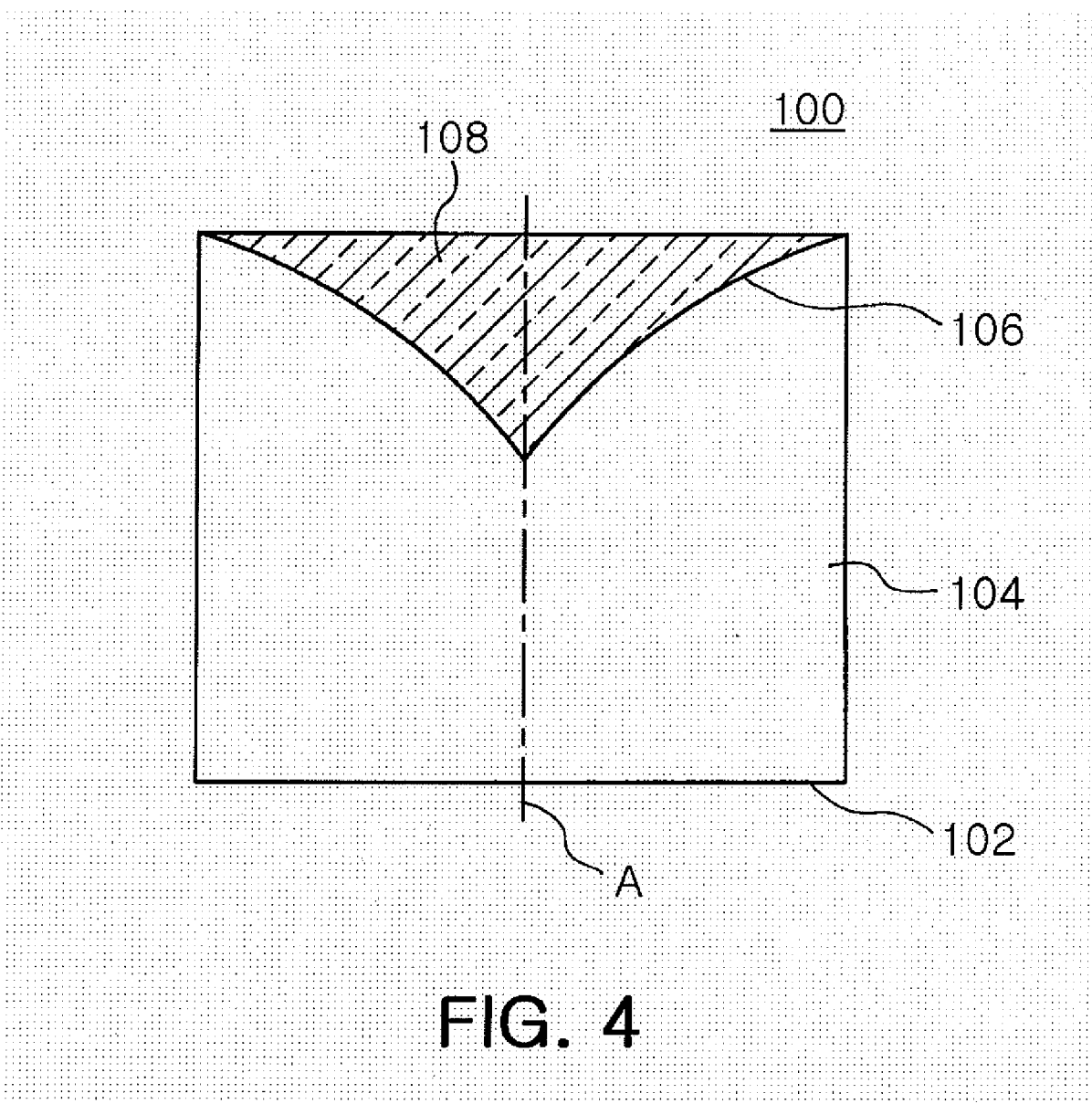
FIG. 4 is a sectional view illustrating a first embodiment of a side-emitting LED package according to the invention.

As shown in FIG. 4, a light emitting diode (LED) package 100 includes a bottom surface 102, a light exiting surface 104 cylindrically extended from the bottom surface 102 and a reflecting surface 106 formed on an opposite side of the bottom surface 102. The reflecting surface 106 is symmetrical around the central axis A of the package 100 such that light incident from the bottom surface 102 is reflected toward the light exiting surface 104.

Also, the LED package of the invention 100 further includes a scattering area 108 formed on the reflecting surface 106. The reflecting surface 106 has a funnel-shaped concave section in an upper part of the package 100 and the scattering area 108 fills the concave section.

The scattering area 108 is made of scattering material which can diffuse/scatter light incident thereon. The material can be obtained by, for example, applying an ink which is used for a dot pattern on a reflecting plate of a general side-emitting backlight device.

The scattering material is made of a light transmissible binder, a plurality of fine scattering particles dispersed therein and a solvent. The scattering particles are powder of at least one selected from a group consisting of $TiO_2$, $SiO_2$, $CaCo_3$, $SnO_2$, $Nb_2O_5$, $ZnO_2$, $MgF_2$, $CeO_2$, $Al_2O_3$, $HfO_2$, $Na_3LaF_6$ and $LaF_6$. The scattering particles are sized from about several nm to several μm and uniformly dispersed in the binder. Examples of the binder include an acrylic binder, an urethanic binder, a mixed binder, a proteinic binder and a mixture. The solvent controls viscosity of the scattering material. The scattering material has a viscosity of a bout 2,000 to 5,000 cps, and preferably 4,000 cps.

With such scattering materials hardened, the solvent evaporates, leaving only the light transmissible binder and scattering particles, and resultantly forming the scattering area 108.

Figure 5:
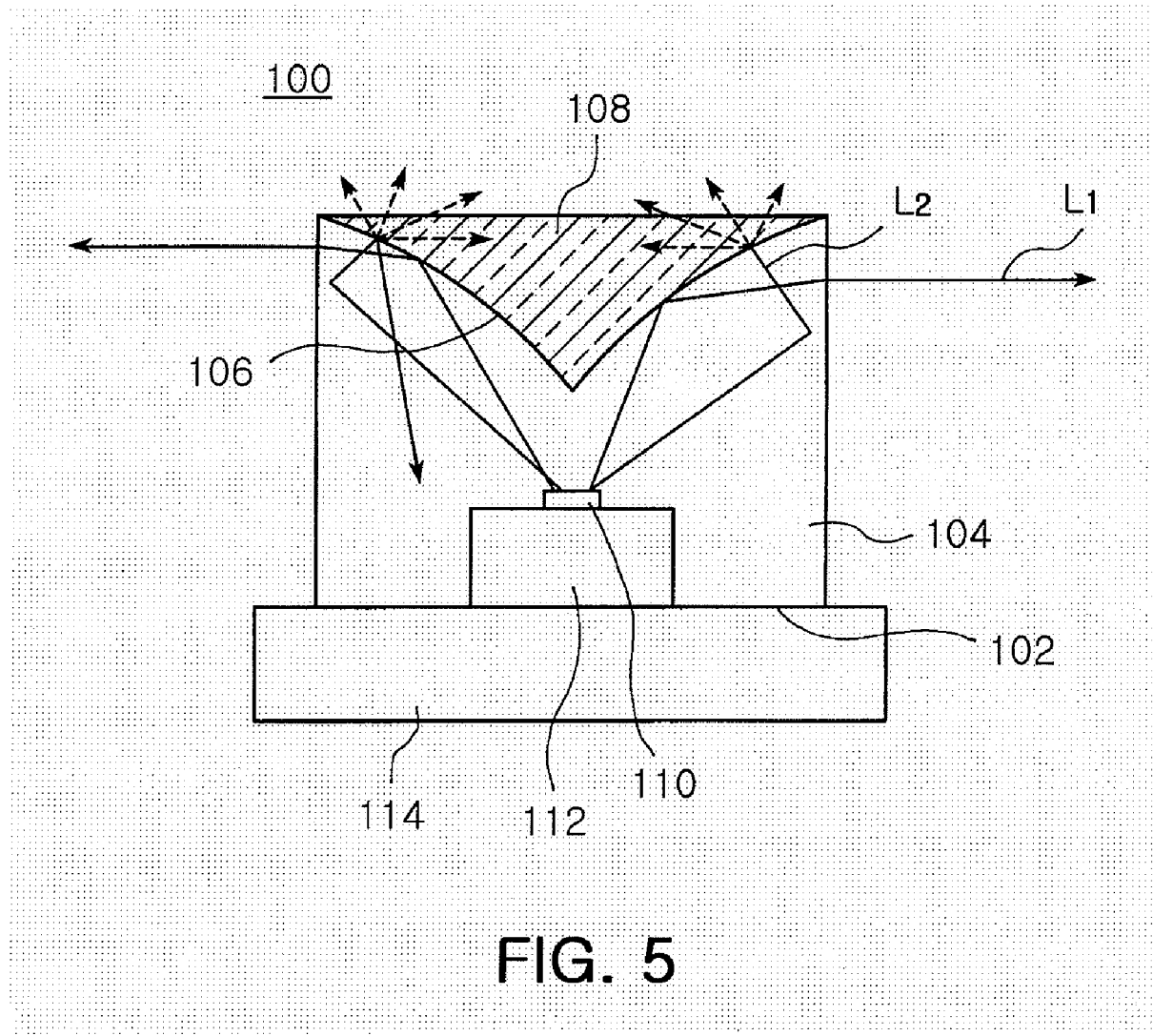
FIGS. 5 and 6 are sectional views for explaining operation of the LED package of FIG. 4.
Figure 6:
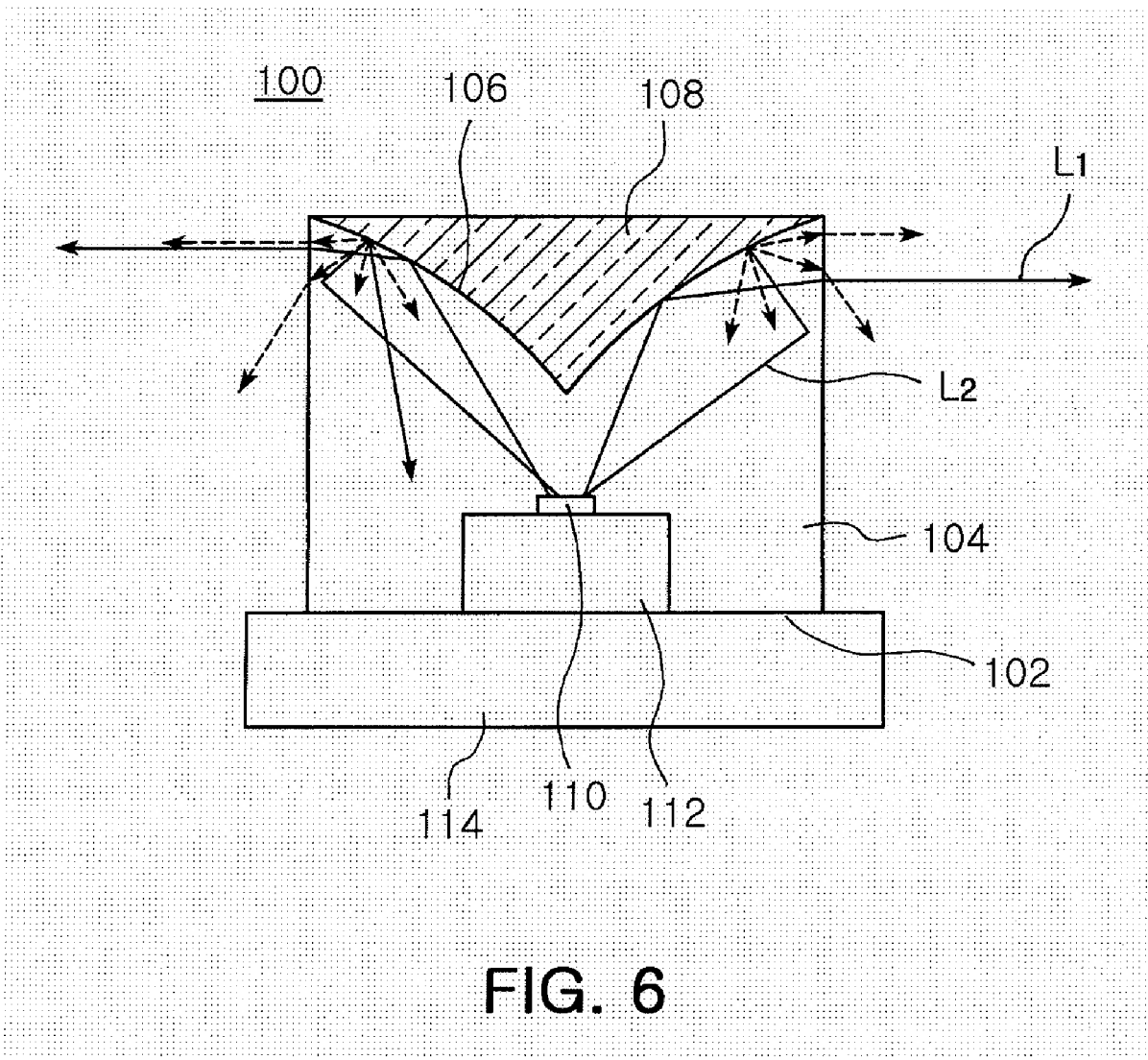

With reference to FIGS. 5 and 6, the LED package 100 of the invention will be explained in greater detail.

FIGS. 5 and 6 show the LED package 100 of FIG. 4 having an LED chip 110 molded therein. That is, the LED chip 110 and a submount 112 supporting the chip 110 are disposed inside the package 100 and also supported by a substrate 114 lying under. Meanwhile, inside the LED package 100, silicone (not illustrated) may be provided to encompass the LED chip 110 and optionally the submount.

First, referring to FIG. 5, when the LED chip 110 emits light, light L1 is directly incident on a reflecting surface 106 and is reflected by the reflecting surface 106 to exit outward through the light-exiting surface 104. That is, the light L1 is emitted sideward. Meanwhile some portion of light L2 strikes the light-exiting surface 106 first to enter the reflecting surface 106. The light L2 is scattered by the scattering area 108 and transmitted upward. Thereby, when emitted upward from the LED package 100 through the reflecting surface 106, the light L2 is scattered by the scattering area 108 and emitted upward at a mild and uniform intensity.

Also, referring to FIG. 6, some portion of light L1 generated in the LED chip is reflected onto a reflecting surface 106 as shown in FIG. 5 and is emitted sideward through a light-exiting surface 104. Meanwhile, the light L2 hits the light-exiting surface 106 first to become incident on the reflecting surface 106. Then the light L2 is scattered and reflected by the light scattering area 108 and emitted outward again through the package 100. Thereby, the light L2 is diffused by the scattering area 108 and illuminates a surrounding area of the package 100 at a mild and uniform intensity.

Both transmission and reflection properties of the LED package 100 explained with reference to FIGS. 5 and 6 can be attained in a package. At this time, properties of scattering particles included in the scattering area 108, more specifically, the kind, quantity and ratio can be adjusted so that the scattering area 108 exhibits superior properties for transmission and reflection.

Light scattering in the scattering area 108 will be explained hereunder with reference to FIGS. 7a and 7b.

Figure 7A:
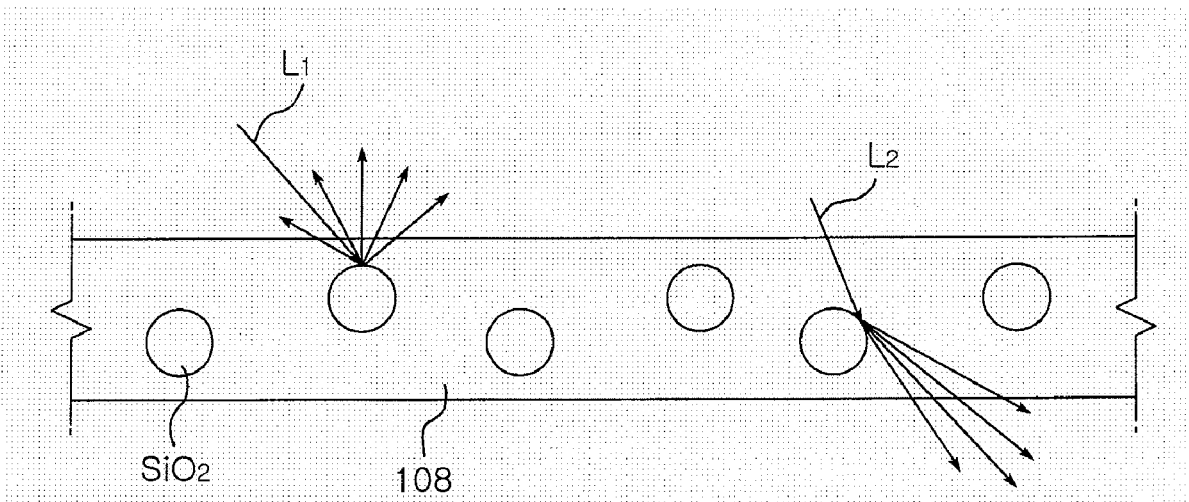
FIGS. 7a and 7b are sectional views for explaining scattering of light by scattering particles.

Referring to FIG. 7a, light L1, L2 incident on a scattering area 108 is scattered through $SiO_2$ particles. That is, the light L1 is scattered by $SiO_2$ particles, and reflected from the scattering area 108. Meanwhile, the light L2 is scattered by $SiO_2$ particles while transmitting the scattering area 108. Therefore, by applying the scattering area 108 on the reflecting surface 106 of the package 100, light is emitted at a uniform intensity across the reflecting surface 106 as stated above with reference to FIG. 5. Alternatively, $TiO_2$ particles may be used instead of $SiO_2$ particles.

Figure 7B:
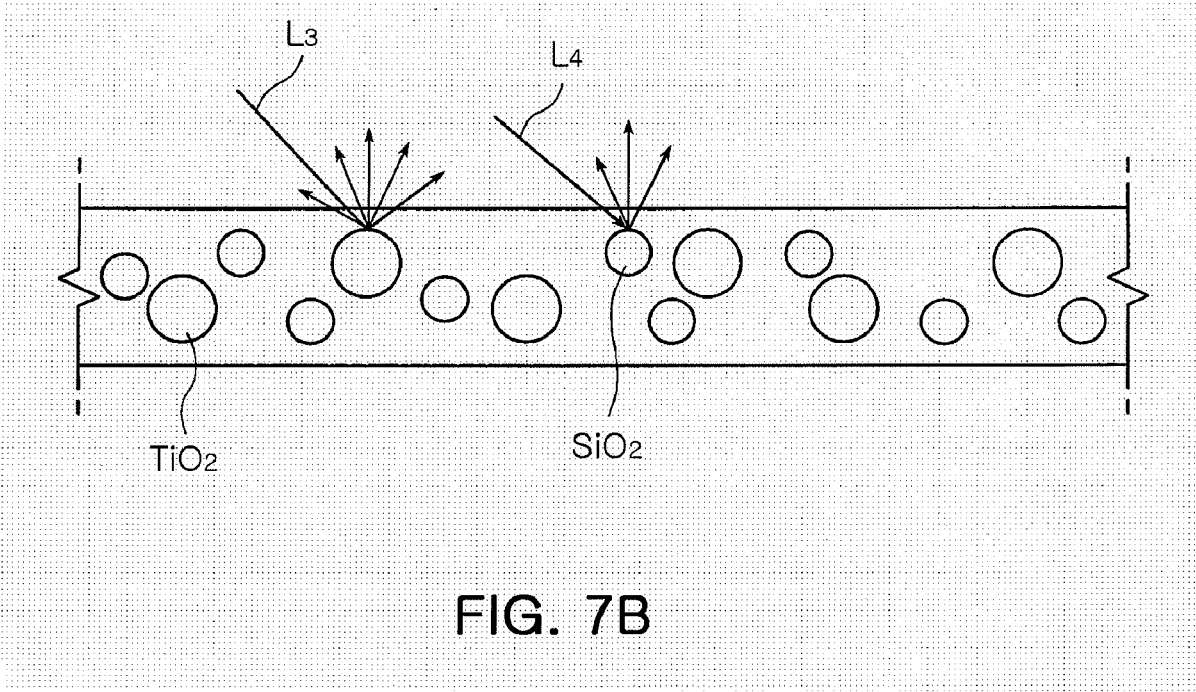

Referring to FIG. 7b, light L3, L4 incident on the scattering area 108 is scattered by $TiO_2$ and $SiO_2$ particles. Although not illustrated, some portion of light, like the light L2 of FIG. 7a, may be scattered by $TiO_2$ and $SiO_2$ particles while transmitting the scattering area 108. By adjusting a ratio of $TiO_2$ and $SiO_2$ in this scattering area 108 of FIGS. 7a and 7b, reflectivity (scattering) and transmissibility of the scattering area 108 can be controlled.

The scattering particles are exemplified by $TiO_2$ and $SiO_2$ of FIGS. 7a and 7b but not limited thereto. For example, the scattering particles may be substituted by $CaCo_3$, $SnO_2$, $Nb_2O_5$, $ZnO_2$, $MgF_2$, $CeO_2$, $Al_2O_3$, $HfO_2$, $Na_3LaF_6$ and $LaF_6$ as described above or equivalents thereof.

Figure 8:
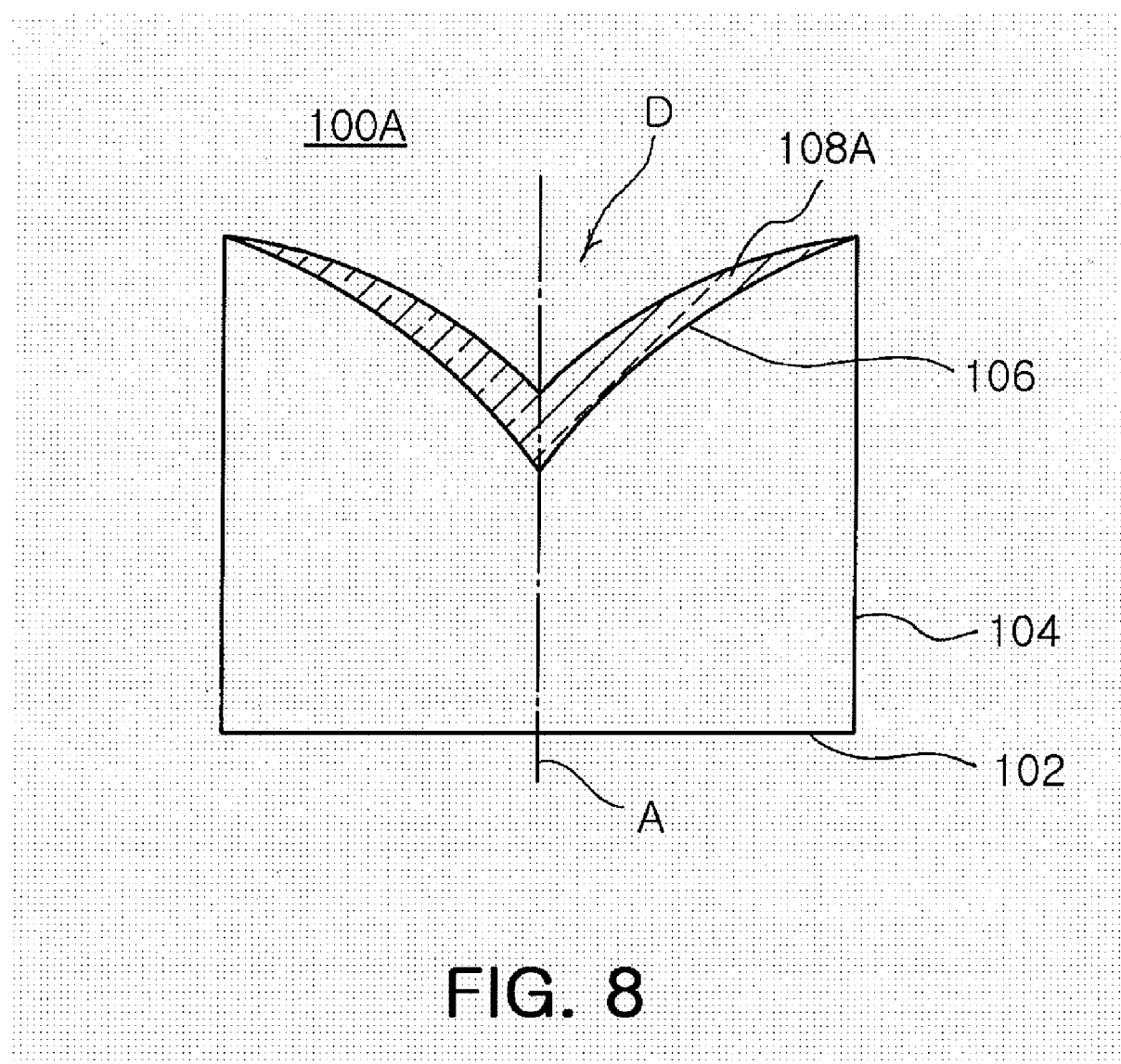
FIGS. 8 to 10 are sectional views illustrating second to fourth embodiments of the side-emitting LED package according to the invention.

FIG. 8 illustrates a second embodiment of the LED package of the invention. Referring to FIG. 8, the LED package 100A of the invention is substantially identical to the LED package 100 of FIG. 4 except that the former has a scattering film 108A applied on a reflecting surface 106. The scattering film 108A is made of materials substantially identical to the scattering area 108 of FIG. 4. Thus, the scattering film 108A can transmit/reflect light while scattering/diffusing it. In addition, transmissibility and reflectivity can be controlled by adjusting properties of the scattering particles.

Thereby, the scattering film 108A requires a less amount of the scattering particles and a binder forming the scattering film 108A than the scattering area 108 of the LED package 100 of FIG. 4. Also, the scattering film 108A of FIG. 8 has a uniform thickness, in general so that light can be transmitted at a uniform intensity across the film.

Figure 9:
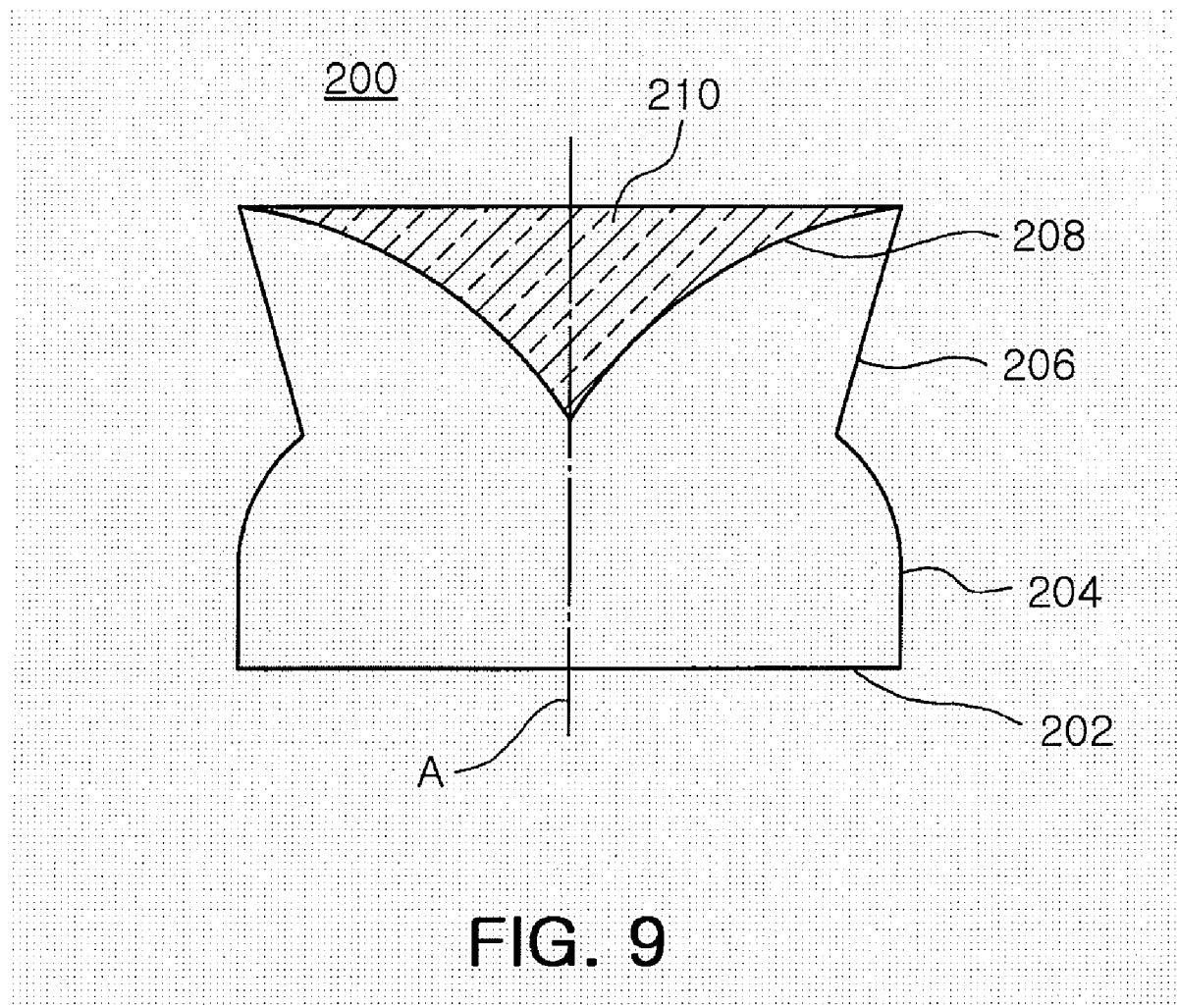

FIG. 9 shows a third embodiment of the LED package of the invention. Referring to FIG. 9, the LED package 200 of the invention includes a bottom surface 202, first and second light exiting surfaces 204 and 206 cylindrically extended from the bottom surface 202 and a reflecting surface 208 positioned on an opposite side of the bottom surface 202. The reflecting surface 206 is symmetrical around a central axis A of the package 200 such that light incident from the bottom surface 202 is reflected toward the light exiting surface 204. Further, the first light exiting surface 204 is extended in a smooth convex curve from the bottom surface 202 and the second light exiting surface 206 is extended from the first light exiting surface 204 to an edge of the reflecting surface 208, obliquely slanted with respect to the central axis A of the package.

Also, the LED package 200 of the invention further comprises a scattering area 210 formed on the reflecting surface 208. The reflecting surface 202 has a funnel-shaped concave section in an upper part of the package 200 and the scattering area 210 fills the concave section.

The scattering area 210 is substantially identical to the scattering area 108 of the LED package 100 of FIG. 4, and thus will not be explained further.

Figure 10:
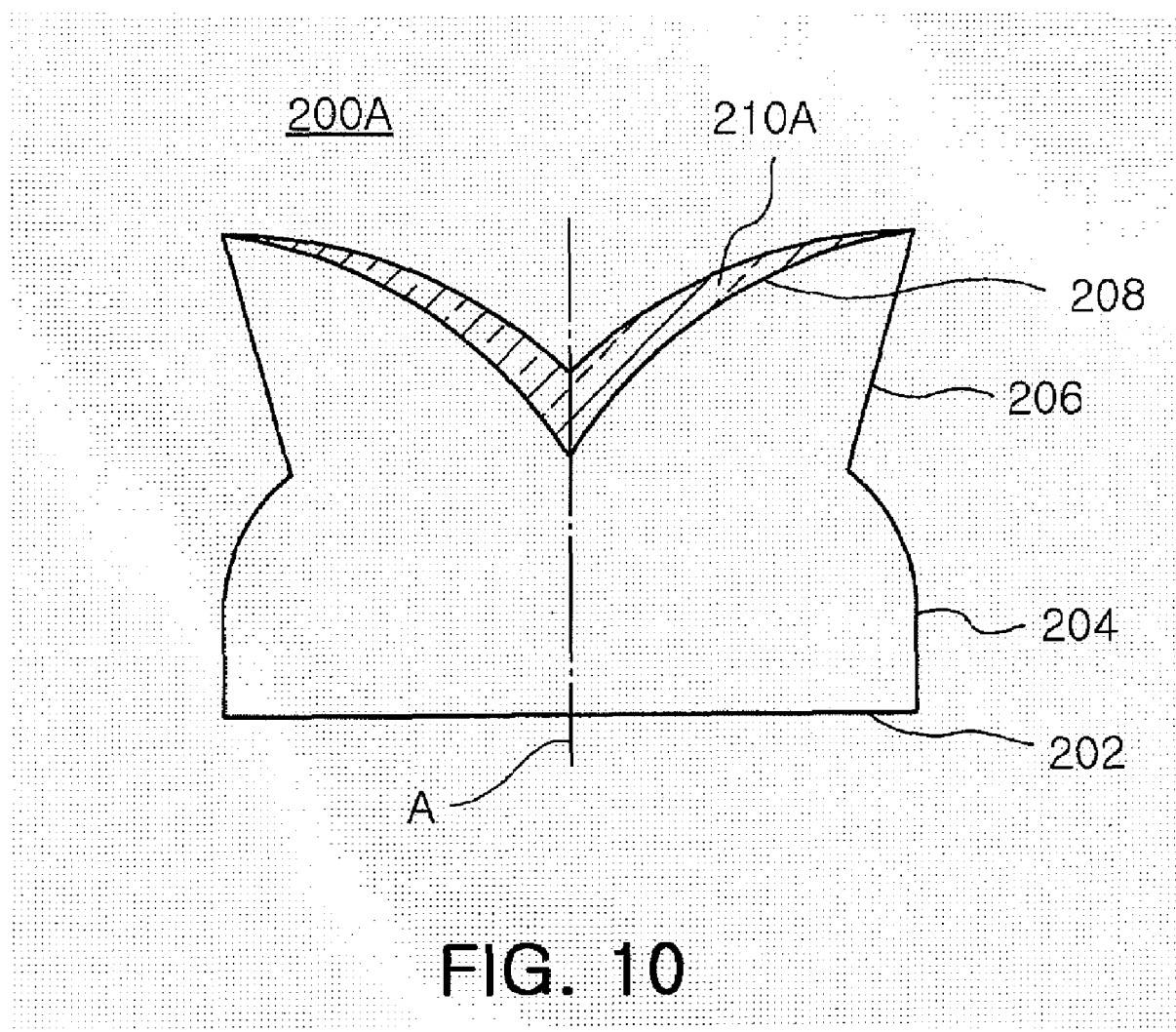

FIG. 10 shows a fourth embodiment of the LED package of the invention. Referring to FIG. 10, the LED package 200A of the invention is substantially identical to the LED package 200 of FIG. 9 except that the former has a scattering film 210A applied on the reflecting surface 208.

As a result, a less amount of scattering particles and binder can be used to form the scattering film 210A than the scattering area 210 of the LED package 200 of FIG. 9. In addition, the scattering film 210A of FIG. 10 has a uniform thickness, in general so that light is transmitted at a uniform intensity across the film.

Then, with reference to FIG. 11, an explanation will be given regarding a process of forming a scattering area 108 in the side-emitting LED package 100 of FIG. 4.

Figure 11A:
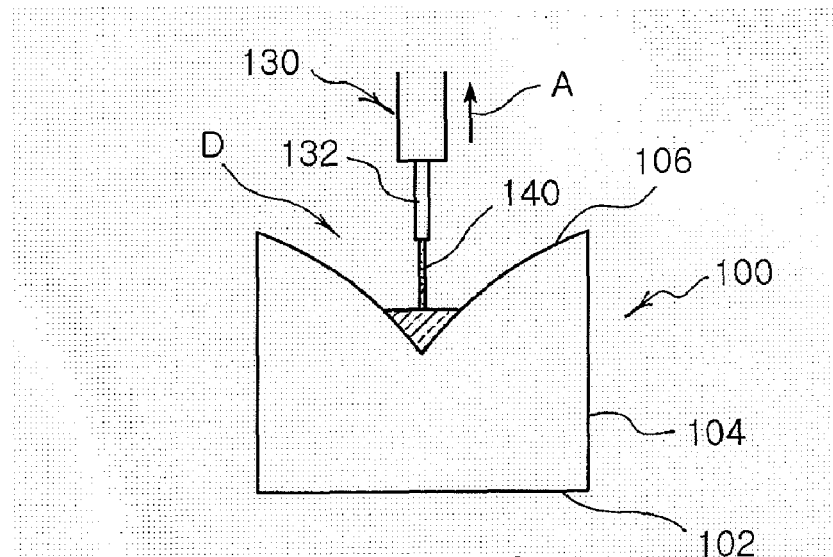
FIG. 11 is a sectional view for explaining a process of forming a scattering area in the side-emitting LED package of FIG. 4.

First, with reference to FIG. 11(a), the LED package 100 as shown in FIG. 4 is prepared, which includes a bottom surface 102, a light exiting surface 104 cylindrically extended from the bottom surface 102 and a reflecting surface 106 positioned on an opposite side of the bottom surface 102. Thereafter, a predetermined amount of scattering material 140 is injected via a dispenser 130 to fill a concave section D defined by the reflecting surface 106.

The scattering material 140 is injected preferably with a nozzle 132 of the dispenser 130 kept inside the concave section D. Then, as the injected scattering material 140 fills the concave section D, the dispenser 130 is moved upward in an arrow A direction while injecting the scattering material 140.

The scattering material 140 is selected from liquid materials which can be hardened by an adequate processing. The scattering material 140, for example, can be obtained by applying an ink which is used for a dot pattern on a reflecting plate of a side-emitting backlight device.

Further, the scattering material is made of a light transmissible binder, a plurality of fine scattering particles dispersed therein and a solvent. The scattering particles are powder of at least one selected from a group consisting of $TiO_2$, $SiO_2$, $CaCO_3$, $SnO_2$, $Nb_2O_5$, $ZnO_2$, $MgF_2$, $CeO_2$, $Al_2O_3$, $HfO_2$, $Na_3LaF_6$ and $LaF_6$. Preferably, the scattering particles are sized from several nm to several μm and dispersed uniformly in the binder. The solvent controls viscosity of the scattering material. The scattering material has a viscosity of about 2000 to 5000 cps, and preferably 4000 cps.

Figure 11B:
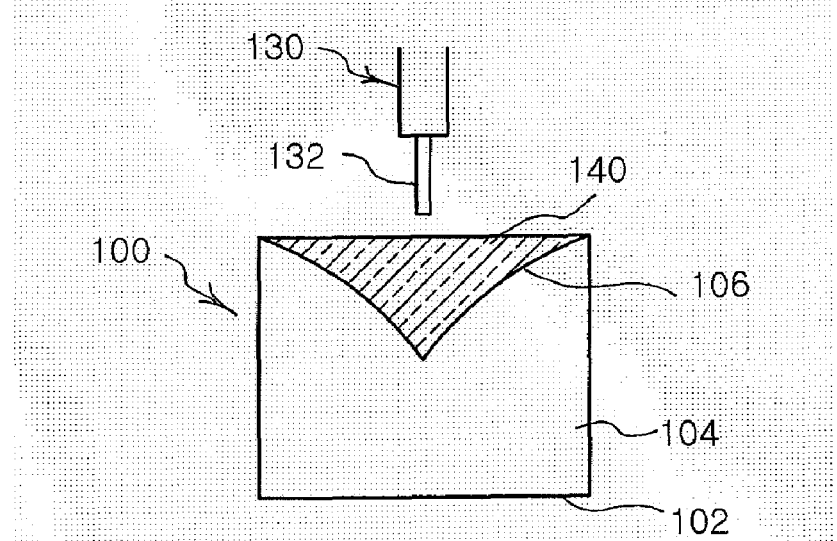

Then, as shown in FIG. 11(b), if the scattering material 140 fills the concave section D completely or to a predetermined level, the dispenser 130 is stopped to discontinue injection of the scattering material 140.

Figure 11C:
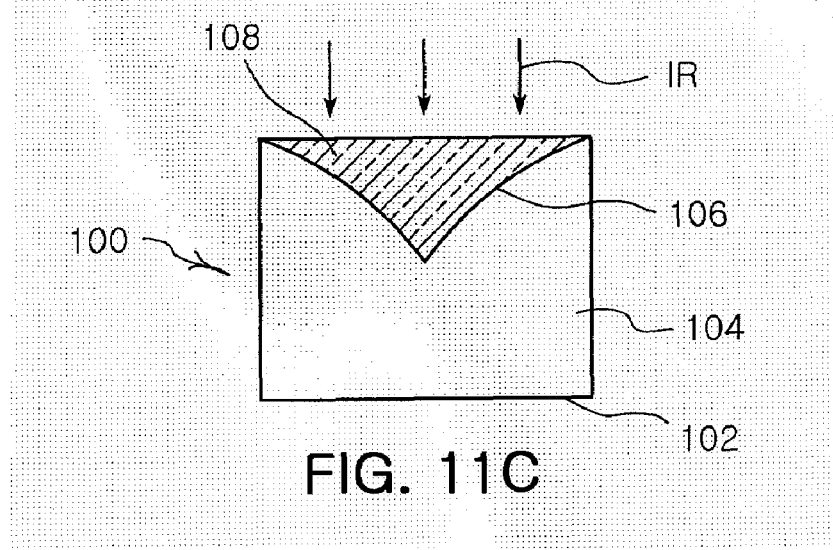

Thereafter, as shown in FIG. 11(c), an infrared ray (IR) is irradiated to harden the scattering material 140 and thus obtain the LED package 100 having the scattering area 108 of the invention. In this case, to harden the scattering material, the package 100 is placed into an infrared ray heating equipment and irradiated by an infrared ray at a room temperature for about 30 minutes.

Alternatively, the package 100 is placed into a heat dryer to harden the scattering material at a temperature of about 80° C. to 100° C. for about 60 minutes. Further, the scattering materials may be hardened for about 24 hours in a dry, room temperature environment.

With the scattering material 140 hardened, the solvent evaporates, leaving only the light transmissible binder and scattering particles and resultantly forming the scattering area 108 of the invention.

With reference to FIG. 12, an explanation will be given regarding a process of forming a scattering area 108a in a side-emitting LED package 100A shown in FIG. 8.

First, as noted above with reference to FIG. 12(a), an LED package 100A includes a bottom surface 102, a light exiting surface 104 cylindrically extended from the bottom surface 102 and a reflecting surface 106 positioned on an opposite side of the bottom surface 102. Then, a dispenser 130 is used to inject a predetermined amount of scattering material 140a into a concave section D formed on the reflecting surface 106.

Figure 12A:
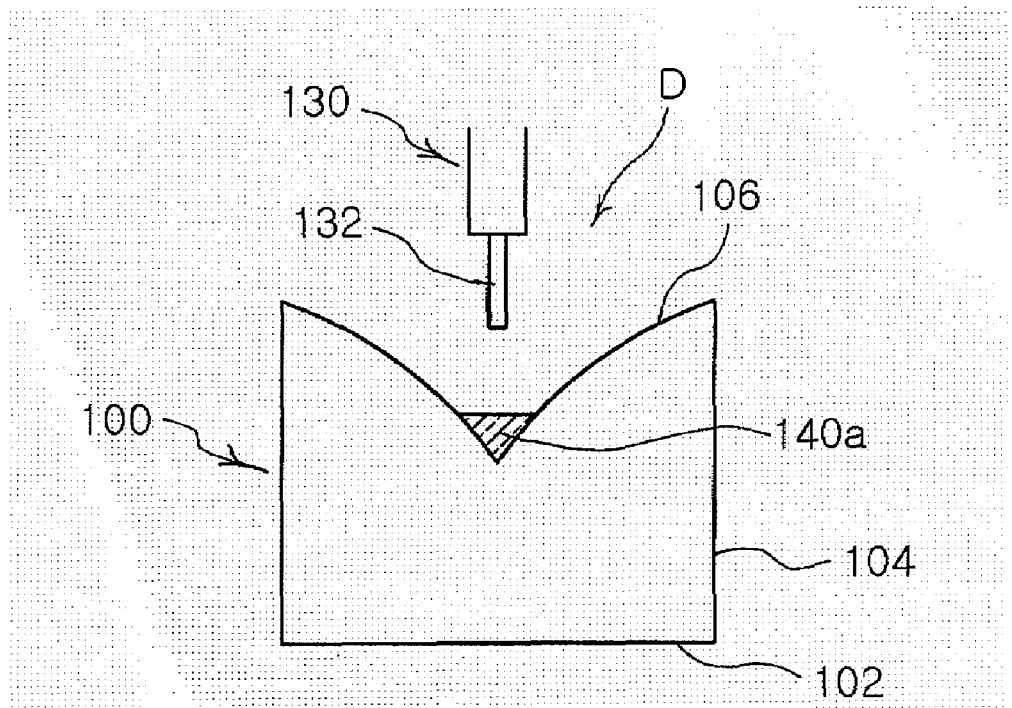
FIG. 12 is a sectional view for explaining a process of forming a scattering area in the side-emitting LED package of FIG. 8.

However, in this process, as shown in FIG. 12(a), the scattering material 140a is injected to fill the concave section only partially. An amount of the scattering material 140A filled can be adjusted properly depending on needs.

At this time, the scattering material 140a is substantially identical to the scattering material 140 stated above.

Figure 12B:
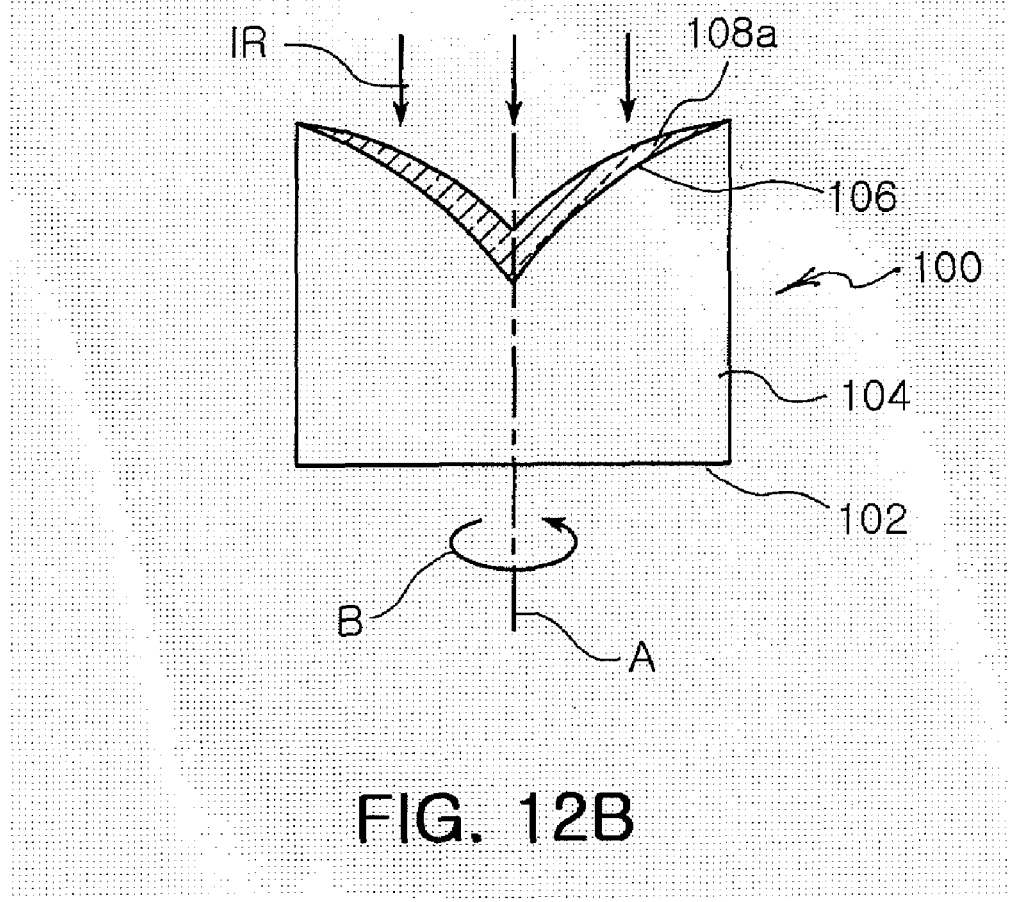

As shown in FIG. 12(b), the LED package is irradiated by an infrared ray while rotating it in an arrow B direction from a central axis to harden the scattering material 140a, thereby obtaining the LED package 100A having the scattering area 108a of the invention. In this case, the LED package is irradiated by an infrared ray at a room temperature for about 10 to 20 minutes via an infrared ray heating equipment to harden the material.

Alternatively, the LED package is placed into a heat dryer to harden the scattering material at a temperature of about 80° C. to 100° C. for about 20 to 30 minutes. Further, the LED may be hardened in a dry, room temperature environment for about 20 to 24 hours.

A comparison was made between a light emitting pattern of the LED package 100 of the invention obtained by such process (FIG. 14) and that of the LED package 10 of the prior art(FIG. 13).

Figure 13A:
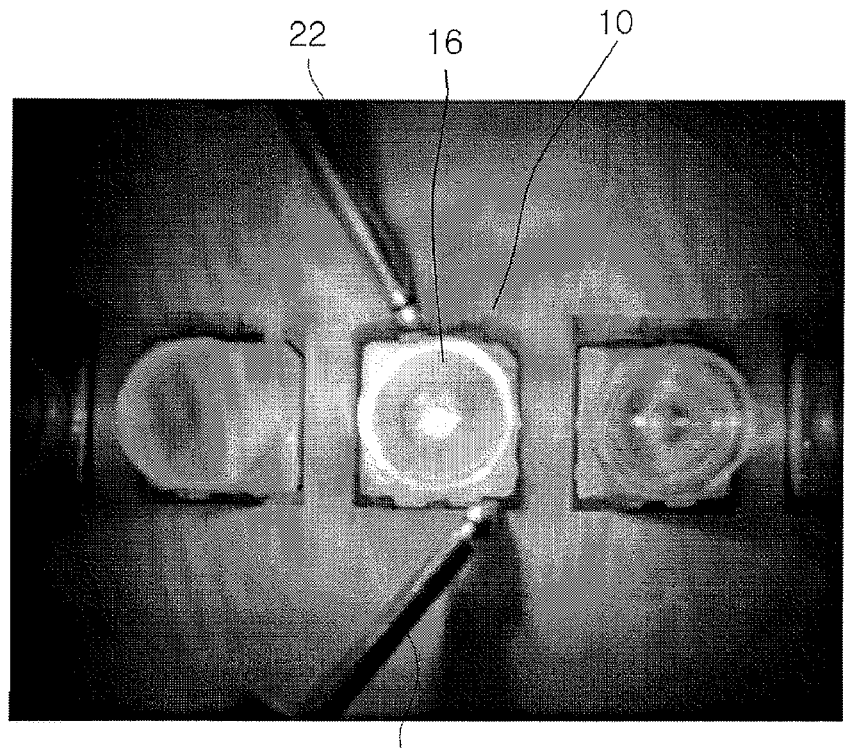
FIG. 13 shows pictures of light-emitting patterns of a side-emitting LED package according to the prior art.
Figure 14A:
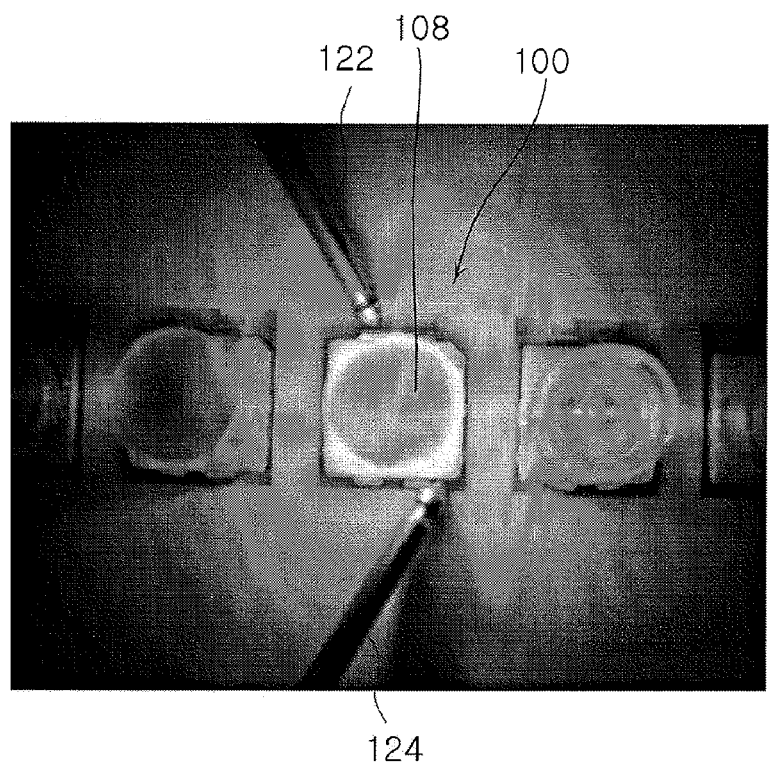
FIG. 14 shows pictures of light-emitting patterns of a side-emitting LED package according to the invention.

First, in a comparison between FIG. 13(a) and FIG. 14(a), in the case of the conventional LED package 10, strong light is emitted upward from an edge and a center of a reflecting surface 16. In contrast, in the case of the LED package 100 of the invention, relatively bright light is emitted upward from an upper edge but milder than light of the conventional LED package. Further, strong light is not emitted from the center of the LED package 100 of the invention. This is because the light emitted upward through the reflecting surface is scattered/diffused via a light scattering area 108 so that it is emitted at a mild and uniform intensity (Refer to FIG. 5).

Figure 13B:
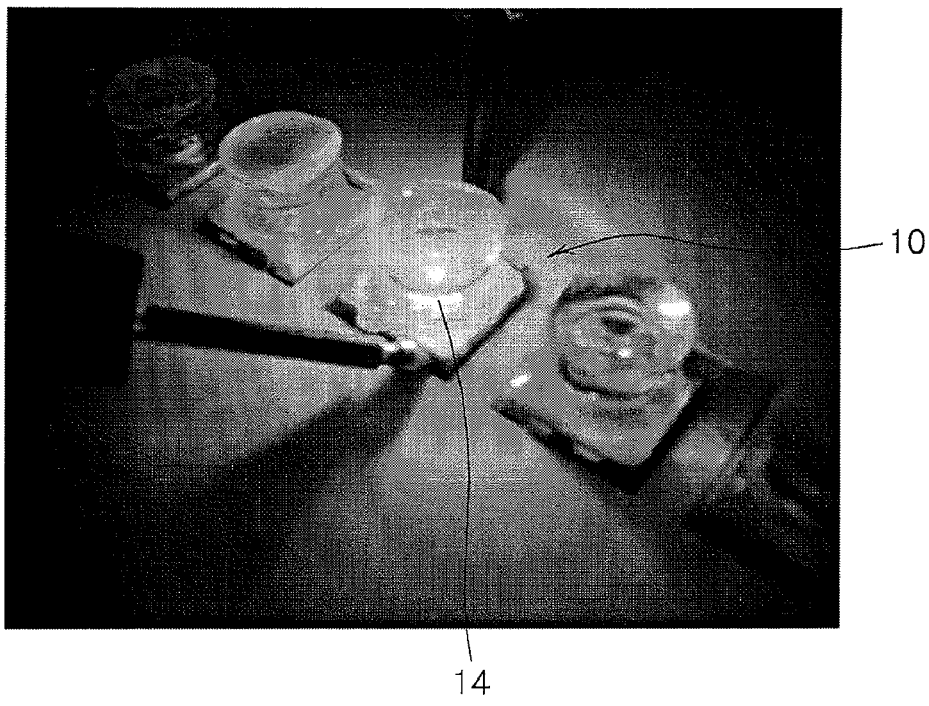
Figure 14B:
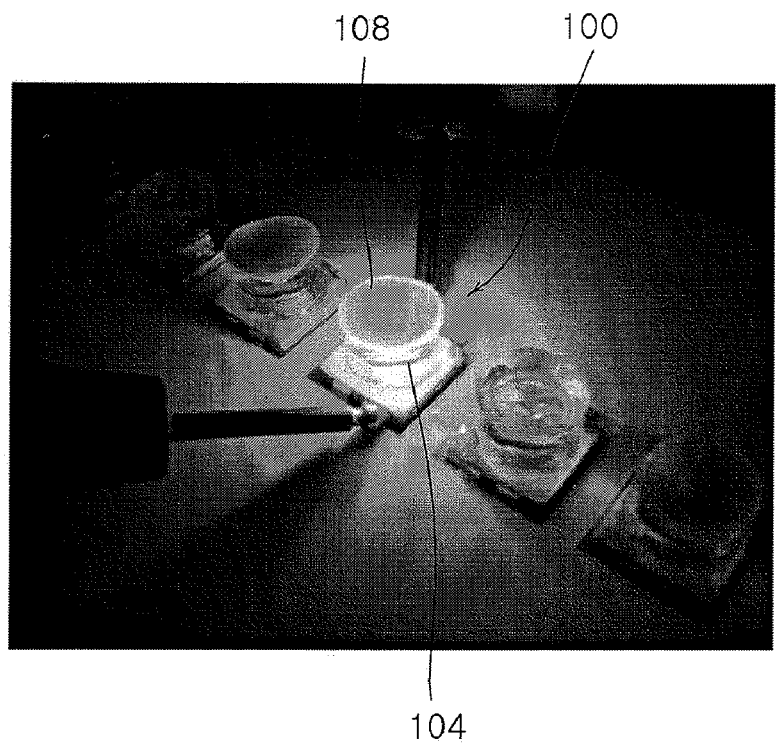

In a comparison between FIG. 13(b) and FIG. 14(b), in the case of the LED-package 100 of the invention, the light exiting through a light exiting surface 104 exhibits a stronger intensity than that of the conventional LED package 10. This is because the light reflected by the light scattering area 108 is directed downward and sideward from the LED package 100, thus increasing a side-emitting efficiency of the LED package 100 (Refer to FIG. 6).

With reference to FIGS. 15 to 18, reflectivity and transmissibility of scattering material of the invention will be explained hereunder.

$TiO_2$ and $SiO_2$ were mixed into a binder and a solvent, varying Wt % thereof to produce a plurality of scattering materials. The resultant mixtures each were coated onto a transparent plate to a thickness of 20 μm. Then the scattering materials were hardened to measure transmissibility and reflectivity thereof by a spectrum equipment of Cary_500 available from Varian of U.S.

For $TiO_2$ constituting the scattering materials, COTIOX KA-100 available from Cosmos Chemical of Korea was employed, and for $SiO_2$, P707 available from Sootech Chemical Industrial of Japan was used. Further, for the binder, a transparent binder manufactured with trade name of Nensyutsu available from Nagase of Japan was applied. For the solvent, a product manufactured with trade name of Special Solvent available from Nagase of Japan was used with a viscosity of 4000 cps.

Figure 15:
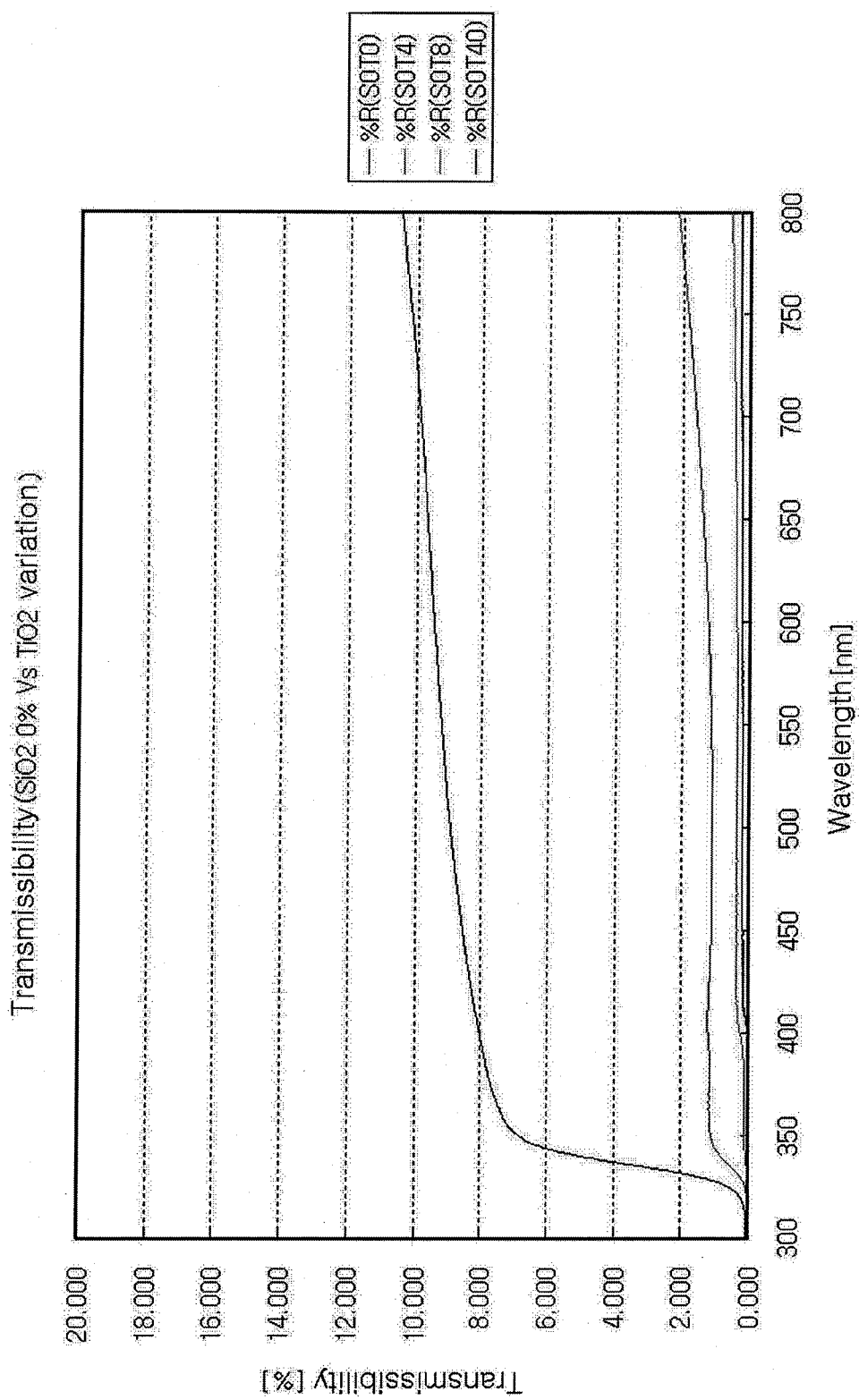
FIG. 15 is a graph illustrating a change in transmissibility of scattering materials in accordance with a change in $TiO_2$.

FIG. 15 is a graph illustrating transmissibility of scattering materials when $SiO_2$ is 0 wt % and $TiO_2$ is varied into 0, 4, 8 and 40 wt %.

Figure 16:
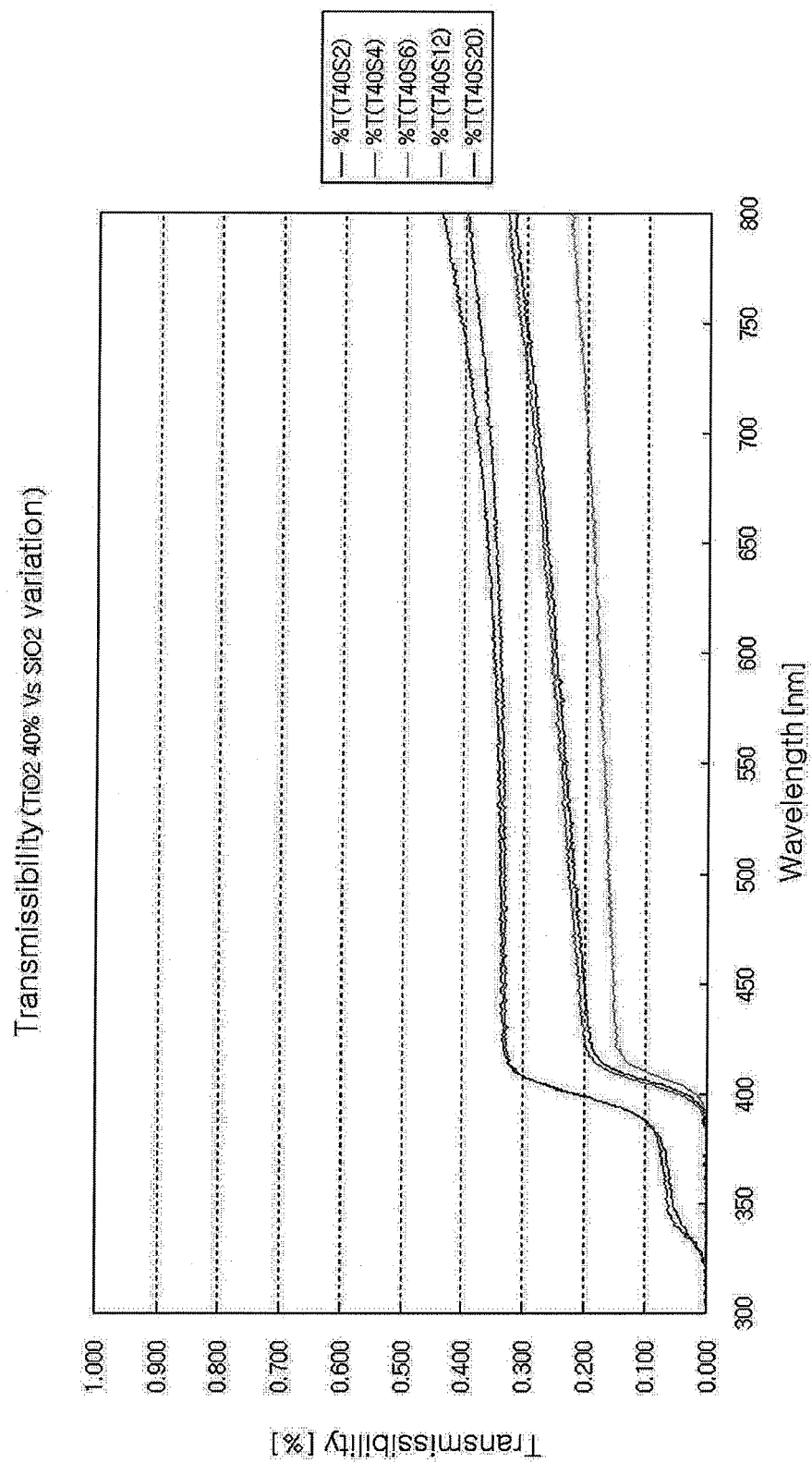
FIG. 16 is a graph illustrating a change in transmissibility of scattering materials in accordance with a change in $SiO_2$.

FIG. 16 is a graph illustrating transmissibility of scattering materials when $TiO_2$ is 40 Wt % and $SiO_2$ is varied into 2, 4, 6, 12 and 20 Wt %.

Figure 17:
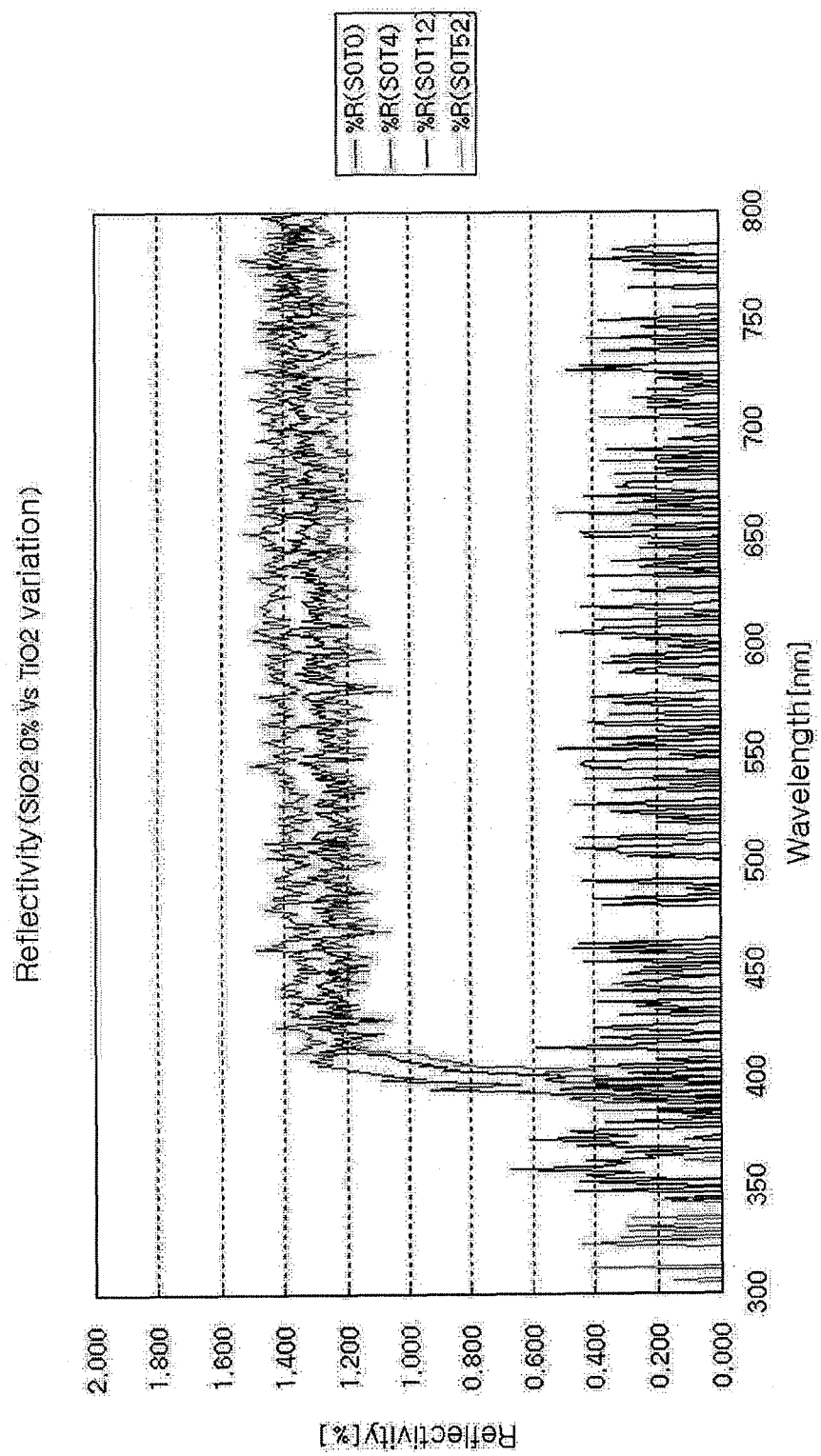
FIG. 17 is a graph illustrating a change in transmissibility of scattering materials in accordance with a change in $TiO_2$.

FIG. 17 is a graph illustrating reflectivity of scattering materials when $SiO_2$ is 0 wt % and $TiO_2$ is varied into 0, 4, 8 and 52 Wt %.

Figure 18:
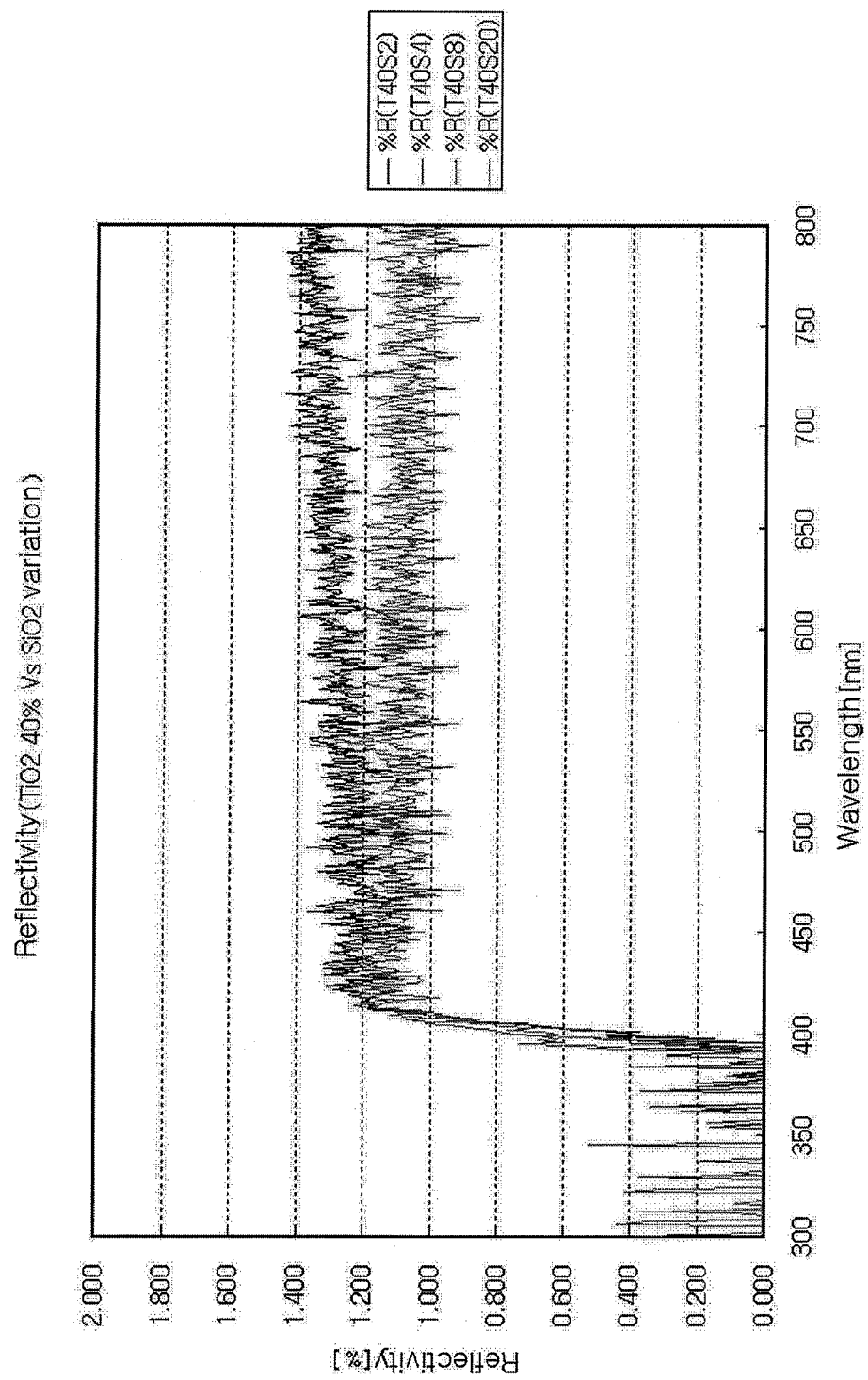
FIG. 18 is a graph illustrating a change in reflectivity of scattering materials in accordance with a change in $SiO_2$.

FIG. 18 is a graph illustrating reflectivity of scattering materials when $TiO_2$ is 40 Wt % and $SiO_2$ is varied into 2, 4, 8 and 20 Wt %.

As shown in FIGS. 15 to 18, a variation in the amount of scattering particles or $SiO_2$ and $TiO_2$ leads to an adjustment in transmissibility and reflectivity of the scattering material. Therefore, the scattering material employed in the LED package of the invention is selected such that transmissibility and reflectivity of the scattering area of the LED package can be properly controlled.

Then, with reference to FIGS. 19 and 20, a backlight device incorporating the side-emitting LED lens of the invention will be explained.

Figure 19:
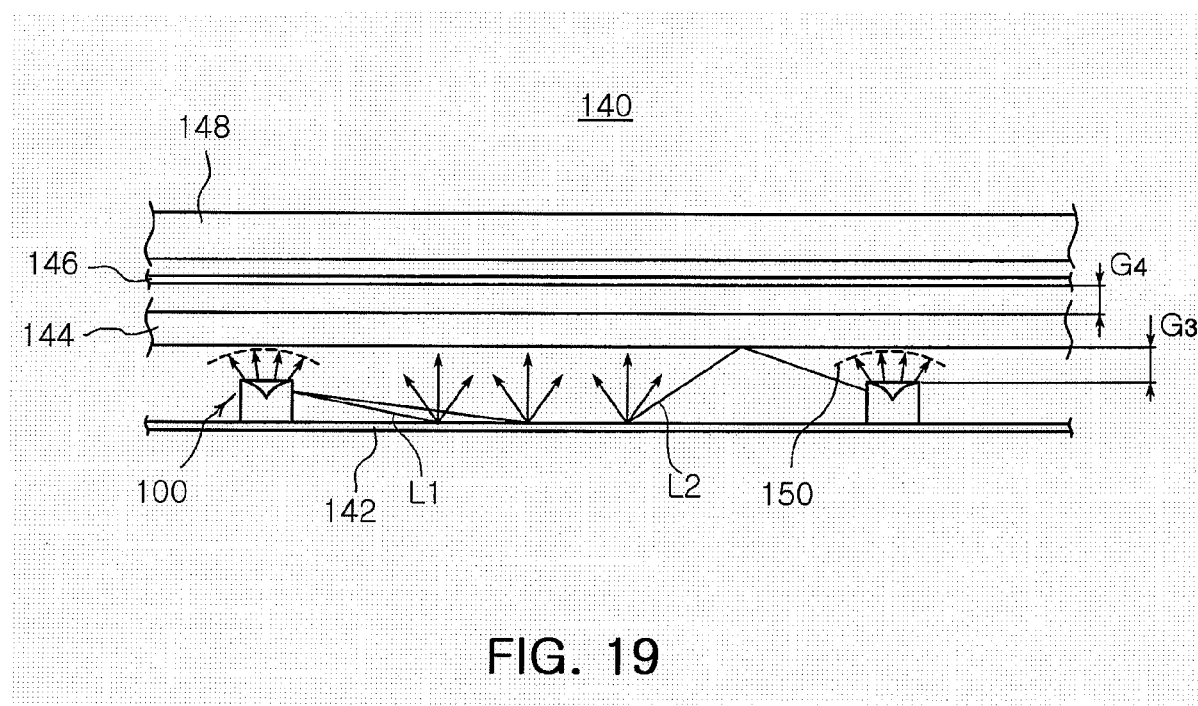
FIG. 19 is a sectional view illustrating a first embodiment of a backlight device incorporating a side-emitting LED package of the invention.

As shown in FIG. 19, the backlight device 140 of the invention includes a flat reflecting plate 142, an array of side-emitting LED packages 100 installed on the reflecting plate 142 and a transparent plate 144 disposed at a predetermined distance G3 over the LED package 100. Further, a diffuser plate 146 is disposed at a predetermined distance over the transparent plate 144 and a liquid crystal panel 148 is disposed over the diffuser plate 146.

The LED packages 100 are configured as stated above with reference to FIG. 4 but not limited thereto. The LED packages 100 may be substituted by the packages 100A, 200, 200A according to other embodiments of the invention as described above and equivalents thereof.

In this arrangement, if light L1 is emitted sideward from the LED package 100, the light L1 is reflected upward from the reflecting plate 142 to enter the transparent plate 144. Also, light L2 directly striking the transparent plate 144 is reflected therefrom to the reflecting plate 142, and then reflected upward from the reflecting plate to enter the transplant plate 144.

Figure 1:
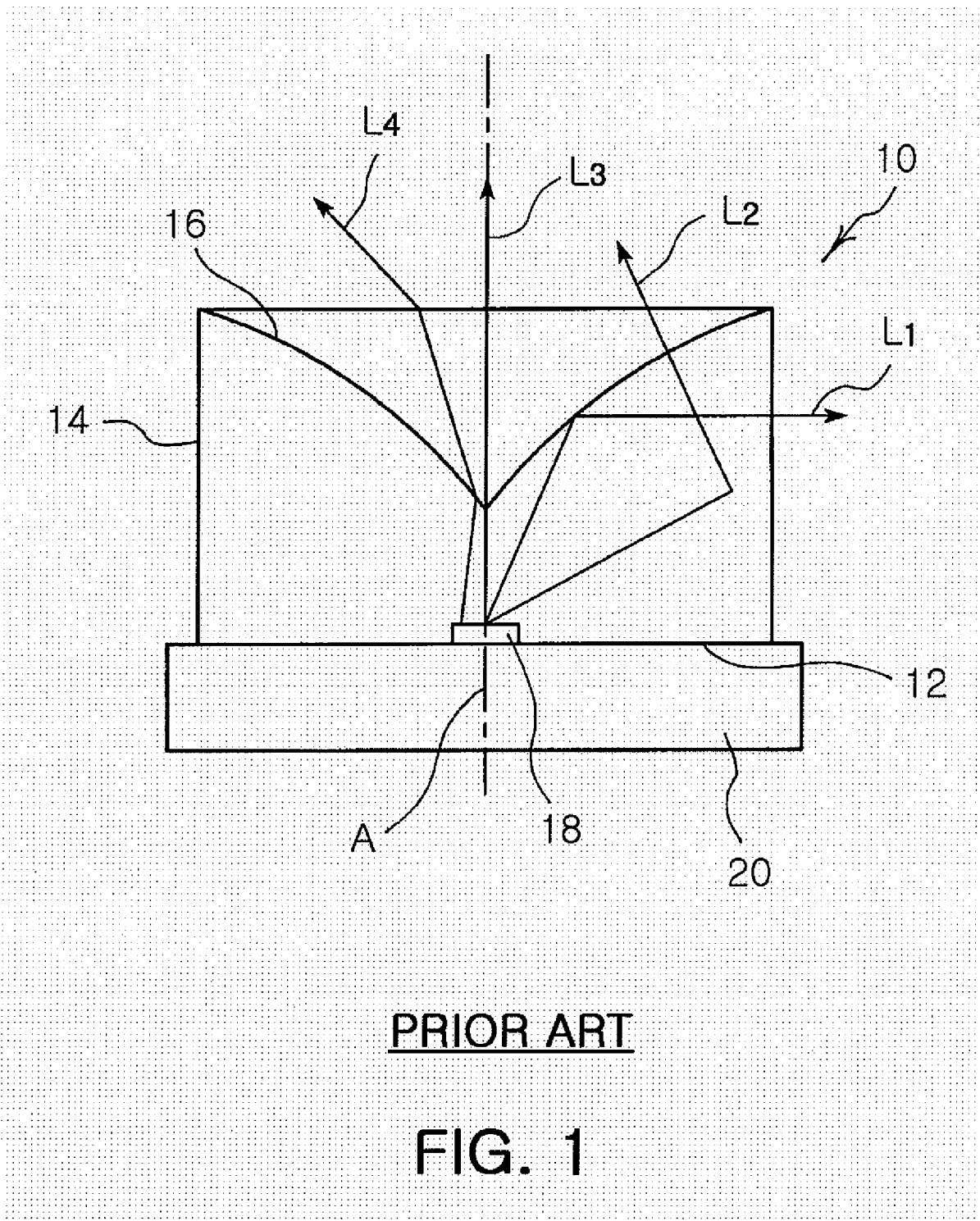
FIG. 1 is a sectional view illustrating a side-emitting LED package according to the prior art.
Figure 2:
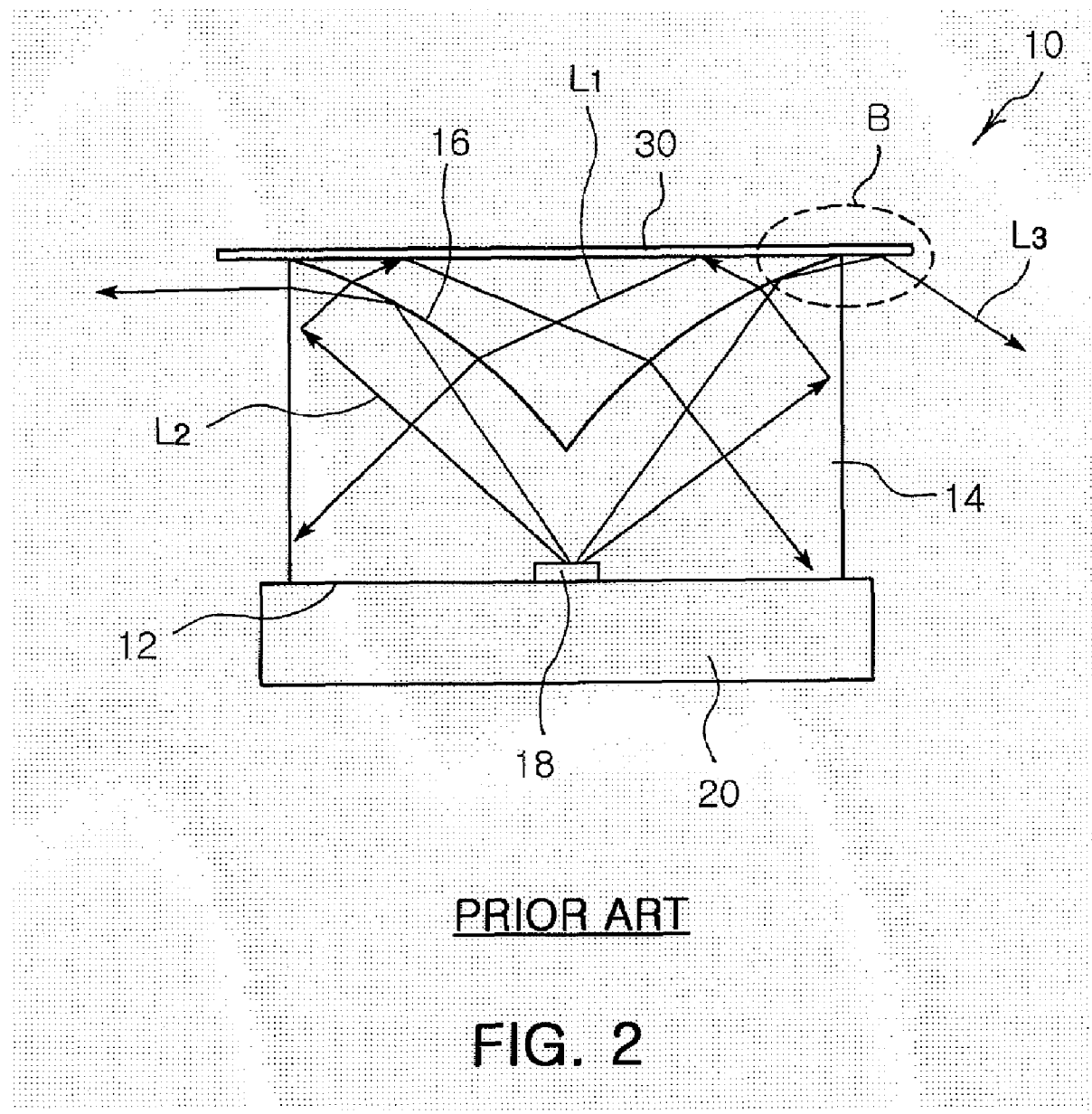
FIG. 2 is a sectional view illustrating a side-emitting LED package employing a reflecting paper according to the prior art.
Figure 3:
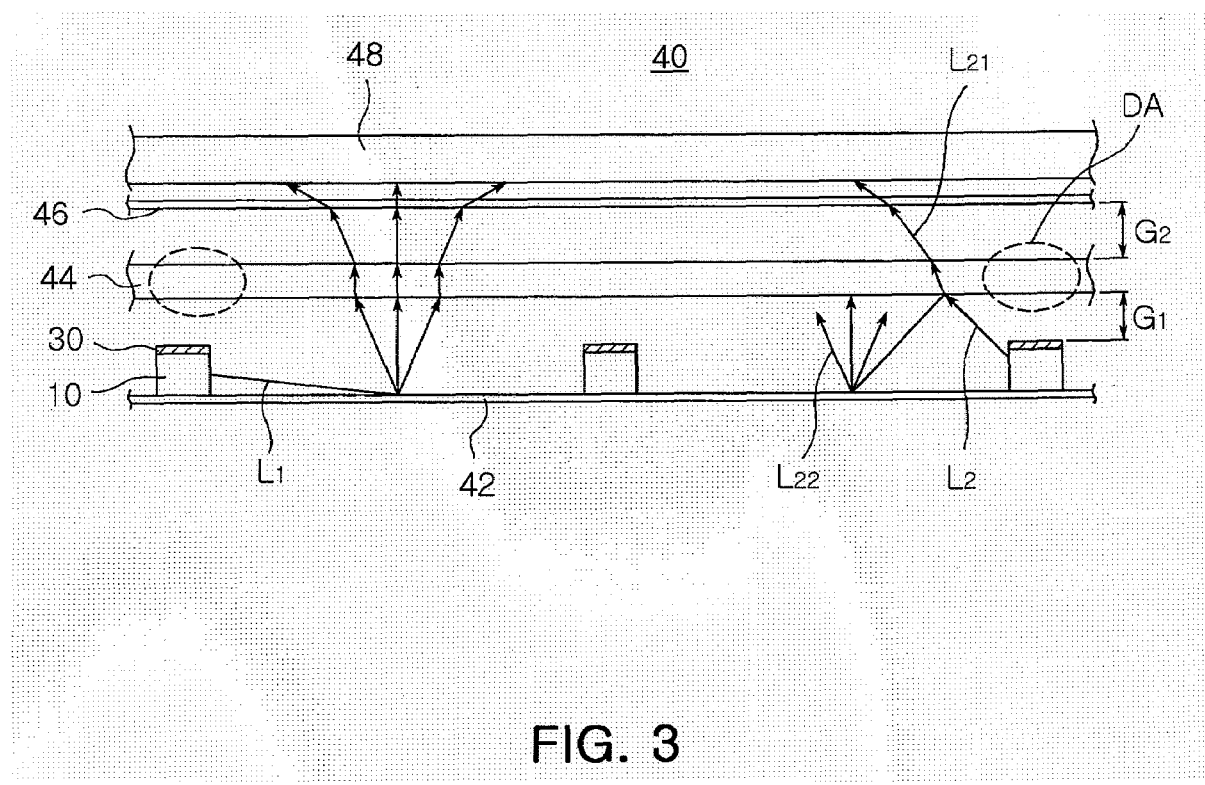
FIG. 3 is a sectional view of a backlight device incorporating the side-emitting LED lens according to prior art.

Meanwhile, some portion of light is emitted upward through a top surface of the LED package 100, that is, a reflecting surface 106 and a scattering area 108. The light emitted exhibits a light emitting pattern as denoted by reference numeral 150 so that a dark area DA of the prior art shown in FIG. 3 is not generated. This obviates a need for maintaining a distance G1 between a LED package 10 and a transparent plate 44 to eliminate the dark area according to the prior art.

That is, according to this invention, the distance G3 between the LED package 100 and the transparent plate 144 can be significantly reduced from that G1 of the conventional technique or can even be eliminated. This advantageously leads to a smaller and slimmer backlight device 140.

Figure 20:
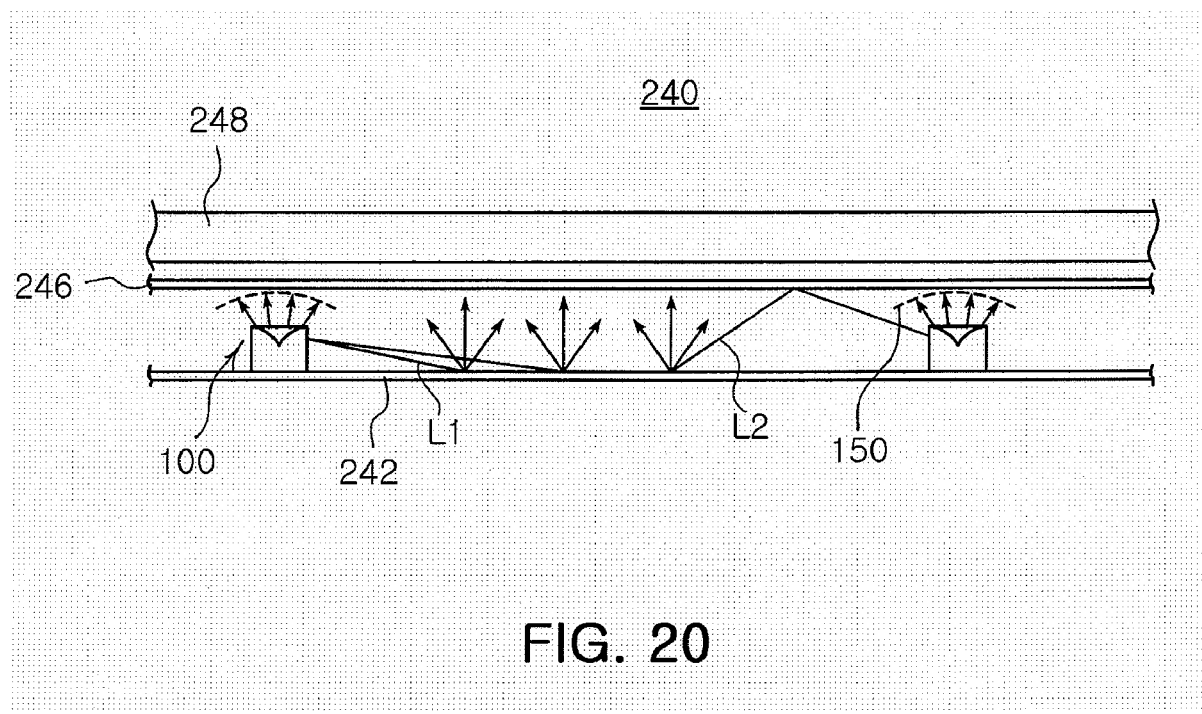
FIG. 20 is a sectional view illustrating a second embodiment of the backlight device incorporating the side-emitting LED package of the invention.

Also, FIG. 20 shows another embodiment of the backlight device of the invention. The backlight device 240 of FIG. 20 includes a flat reflecting plate 242, an array of side-emitting LED packages 100 installed on the reflecting plate 242 and a diffuser plate 246 disposed at a predetermined distance G3 over the LED package 200. At this time, the LED packages 100 are configured as stated above with reference to FIG. 4. Further, the diffuser plate 246 is disposed at a predetermined distance over the transparent plate 244 and a liquid crystal panel 248 is disposed over the diffuser plate 246.

The LED packages 100 are configured as stated above with reference to FIG. 4 but not limited thereto. The LED packages 100 may be substituted by the packages 100A, 200, 200A according to other embodiments of the invention and equivalents thereof.

Unlike the backlight device 140 of FIG. 19, the backlight device 240 of FIG. 20 does not have a transparent plate for the following reason. Light is emitted upward through a top surface of the LED package 100, that is, the reflecting surface 106 and scattering area 108 of FIG. 4, thereby forming a light emitting pattern 150. Then, the pattern 150 is mixed with an upward light pattern formed by light L1 which is reflected upward from the reflecting plate 242 or light L2 which strikes the diffuser plate 244 before being reflected upward by the reflecting plate 242. Thus, this leads to uniformity in an overall upward light pattern. Consequently, the light can become incident on the diffuser plate 244 at a uniform intensity even without the transparent plate.

This allows reduction in the thickness and weight of a conventional transparent plate, thus advantageously leading to a smaller and lighter backlight device.

As stated above, according to the invention, by applying scattering material on a reflecting surface, a reflecting paper does not need to be attached. This simplifies a process, thus saving the manufacture time and cost.

Also, with the scattering material applied on the reflecting surface, some portion of light incident on the reflecting surface to exit upward can be scattered and diffused at a mild and uniform intensity. This allows uniformity in a light pattern reflected upward from the reflecting plate, and thus the distance between the LED package and transparent plate can be decreased or eliminated. This advantageously results in a smaller and a lighter backlight device.

Further, by applying scattering material on the reflecting surface, some portion of light incident on the reflecting surface to exit upward is reflected downward. This prevents light loss resulting from use of a reflecting paper according to the prior art, thereby increasing an overall light-emitting efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A light-emitting diode package comprising:
   a bottom surface;
   a light exiting surface cylindrically extended around a central axis of the package from the bottom surface;
   a reflecting surface positioned opposite the bottom surface and symmetrical around the central axis such that light incident from the bottom surface is reflected toward the light exiting surface; and
   a scattering area formed on the reflecting surface, wherein the reflecting surface has a concave section in an upper part of the package and wherein the scattering area at least in part fills the concave section of the reflecting surface, and
   wherein the reflecting surface has a convex internal face against which light impinges and a concave external face which defines the concave section and on which scattering material which comprises the scattering area is disposed.

2. The light-emitting diode package according to claim 1, wherein the scattering area comprises a plurality of fine scattering particles and a light transmissible binder having the scattering particles dispersed thereon.

3. The light-emitting diode package according to claim 2, wherein the scattering particles comprise powder of at least one selected from a group consisting of $TiO_2$, $SiO_2$, $CaCo_3$, $SnO_2$, $Nb_2O_5$, $ZnO_2$, $MgF_2$, $CeO_2$, $Al_2O_3$, $HfO_2$, $Na_3LaF_6$ and $LaF_6$.

4. The light-emitting diode package according to claim 2, wherein the binder comprises at least one selected from a group consisting of an acrylic binder, an urethanic binder, a mixed binder, and a proteinic binder.

5. The light-emitting diode package according to claim 2, wherein the scattering area is a film applied on the reflecting surface.

6. The light-emitting diode package according to claim 2, wherein the light exiting surface comprises a first light exiting surface extended in a smooth convex curve from the bottom surface and a second light exiting surface slanted from the central axis of the package.

7. A backlight device comprising:

a reflecting plate; and a plurality of light-emitting diode packages on the reflecting plate, wherein the light-emitting diode packages each comprise a bottom surface;

a light exiting surface cylindrically extended around a central axis of the package from the bottom surface;

a reflecting surface positioned opposite the bottom surface and symmetrical around the central axis such that light incident from the bottom surface is reflected toward the light exiting surface; and a scattering material formed on the reflecting surface, wherein the reflecting surface has a concave section in an upper part of the package and wherein the scattering material at least partially fills the concave section of the reflecting surface, and wherein the reflecting surface has a convex internal face against which light impinges and a concave external face which defines the concave section and on which the scattering material which comprises the scattering area is disposed.

8. The backlight device according to claim 7, wherein the scattering area comprises a plurality of fine scattering particles and a light transmissible binder having the scattered particles dispersed thereon.

9. The backlight device according to claim 8, wherein the scattering particles comprise powder of at least one selected from a group consisting of $TiO_2$, $SiO_2$, $CaCo_3$, $SnO_2$, $Nb_2O_5$, $ZnO_2$, $MgF_2$, $CeO_2$, $Al_2O_3$, $HfO_2$, $Na_3LaF_6$ and $LaF_6$.

10. The backlight device according to claim 8, wherein the binder comprises at least one selected from a group consisting of an acrylic binder, an urethanic binder, a mixed binder, and a proteinic binder.

11. The backlight device according to claim 8, wherein the scattering area is a film applied on the reflecting surface.

12. The backlight device according to claim 8, wherein the light exiting surface comprises a first light exiting surface extended in a smooth convex curve from the bottom surface and a second light exiting surface extended from the first light exiting surface to an edge of the reflecting surface, slanted with respect to the central axis of the package.

13. The backlight device according to claim 7, further comprising a diffuser plate positioned over the light-emitting diode packages and a transparent plate positioned between the LED package and the diffuser plate.

* * * * *